(12) United States Patent
Chen et al.

(10) Patent No.: US 12,183,593 B2
(45) Date of Patent: Dec. 31, 2024

(54) MANUFACTURING METHOD FOR MANUFACTURING A PACKAGE STRUCTURE

(71) Applicant: Advanced Semiconductor Engineering, Inc., Kaohsiung (TW)

(72) Inventors: Chia-Pin Chen, Kaohsiung (TW); Chia Sheng Tien, Kaohsiung (TW); Wan-Ting Chiu, Kaohsiung (TW); Chi Long Tsai, Kaohsiung (TW); Cyuan-Hong Shih, Kaohsiung (TW); Yen Liang Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 716 days.

(21) Appl. No.: 17/332,854

(22) Filed: May 27, 2021

(65) Prior Publication Data
US 2022/0384208 A1  Dec. 1, 2022

(51) Int. Cl.
| | | |
|---|---|---|
| *H01L 21/48* | (2006.01) | |
| *H01L 23/00* | (2006.01) | |
| *H01L 25/00* | (2006.01) | |

(52) U.S. Cl.
CPC ............ *H01L 21/485* (2013.01); *H01L 24/81* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 2005/0170641 A1* | 8/2005 | Kondo | ................ H01L 21/7684 257/E21.583 |
| 2012/0080832 A1* | 4/2012 | Woodard | ............ H01L 21/6838 428/64.1 |

* cited by examiner

*Primary Examiner* — Stephanie P Duclair
(74) *Attorney, Agent, or Firm* — FOLEY & LARDNER LLP

(57) ABSTRACT

A manufacturing method for manufacturing a package structure is provided. The manufacturing method includes: (a) providing a carrier having a top surface and a lateral side surface, wherein the top surface includes a main portion and a flat portion connecting the lateral side surface, and a first included angle between the main portion and the flat portion is less than a second included angle between the main portion and the lateral side surface; (b) forming an under layer on the carrier to at least partially expose the flat portion; and (c) forming a dielectric layer on the under layer and covering the exposed flat portion.

12 Claims, 49 Drawing Sheets

MANUFACTURING METHOD FOR MANUFACTURING A PACKAGE STRUCTURE

BACKGROUND

1. Field of the Disclosure

The present disclosure relates to a manufacturing method, and to a method for manufacturing a package structure.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a yield of the semiconductor substrate may decrease.

SUMMARY

In some embodiments, a manufacturing method comprising: (a) providing a carrier having a top surface and a lateral side surface, wherein the top surface includes a main portion and a flat portion connecting the lateral side surface, and a first included angle between the main portion and the flat portion is less than a second included angle between the main portion and the lateral side surface; (b) forming an under layer on the carrier to at least partially expose the flat portion; and (c) forming a dielectric layer on the under layer and covering the exposed flat portion.

In some embodiments, a manufacturing method comprising: (a) providing an under layer on a carrier, wherein the carrier has a top surface and a lateral side surface connecting and non-parallel with the top surface, and the under layer exposes a peripheral portion of the top surface to define a flat portion connecting the lateral side surface; and (b) forming a material in a flowable state on the under layer and covering the flat portion.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
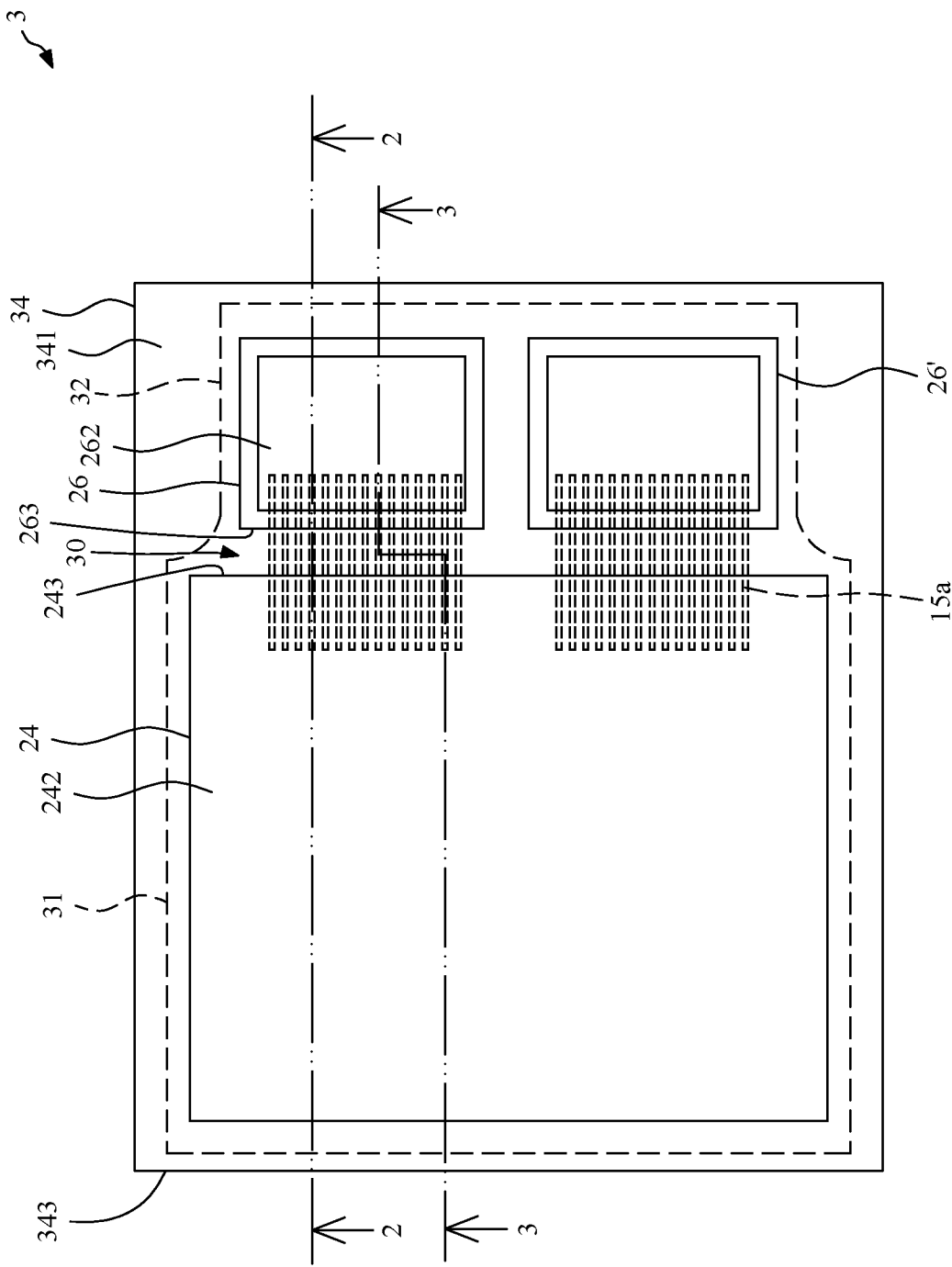
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative method for manufacturing a semiconductor substrate including a plurality of circuit layers, a release film is coated on a carrier, then a plurality of circuit layers and a plurality of dielectric layers are formed on the release film. Then, the release film and the carrier are removed so as to obtain the semiconductor substrate. During such manufacturing process, a bottommost metal layer (e.g., a seed layer) may be formed on the release film. Then, a bottommost dielectric layer may be formed on the bottommost metal layer (e.g., the seed layer) through spin coating. Since sagging of the bottommost dielectric layer may occur at the periphery edge of the carrier, the periphery portion of the bottommost dielectric layer that covers the periphery edge of the bottommost metal layer (e.g., the seed layer) may be very thin. In a worst case, there may be no dielectric layer to cover the periphery edge of the bottommost metal layer (e.g., the seed layer). Thus, the periphery edge of the bottommost metal layer (e.g., the seed layer) may be exposed from the bottommost dielectric layer.

Then, a plurality of openings may be formed in the bottommost dielectric layer by using a developer. Then, a metal layer formed on the bottommost dielectric layer may be patterned to form a circuit layer by using an etchant. However, the developer and the etchant may also etch or damage the periphery edge of the bottommost metal layer (e.g., the seed layer) and the periphery edge of the release film right under the periphery edge of the bottommost metal layer (e.g., the seed layer) because the bottommost dielectric layer can not provide enough protection. As a result, the release film may be peeled off from the carrier readily before the semiconductor substrate is complete. Therefore, a yield of the semiconductor substrate may decrease.

Figure 2:
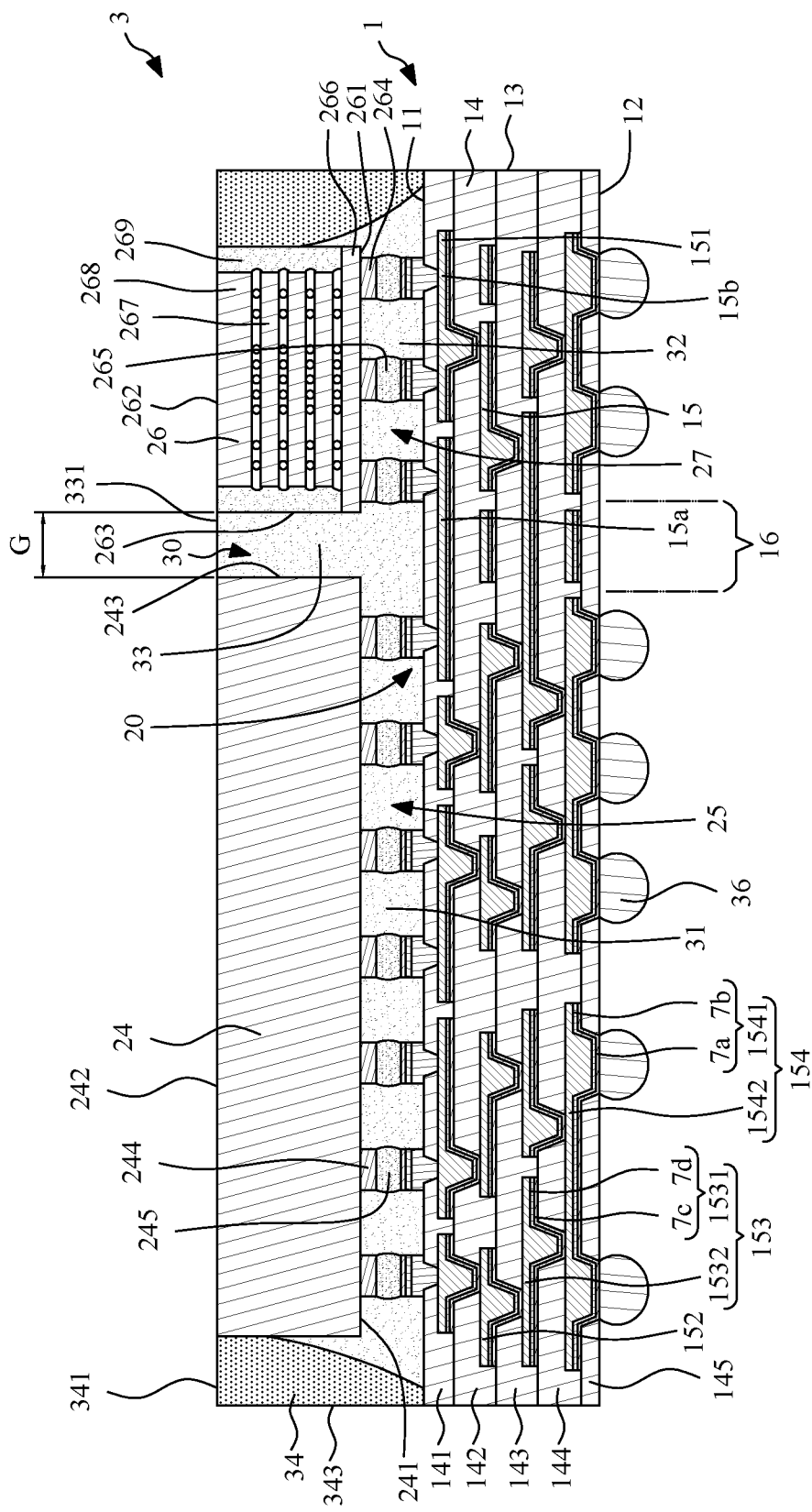
FIG. 2 illustrates a cross-sectional view taken along line 2-2 of the package structure of FIG. 1.
Figure 3:
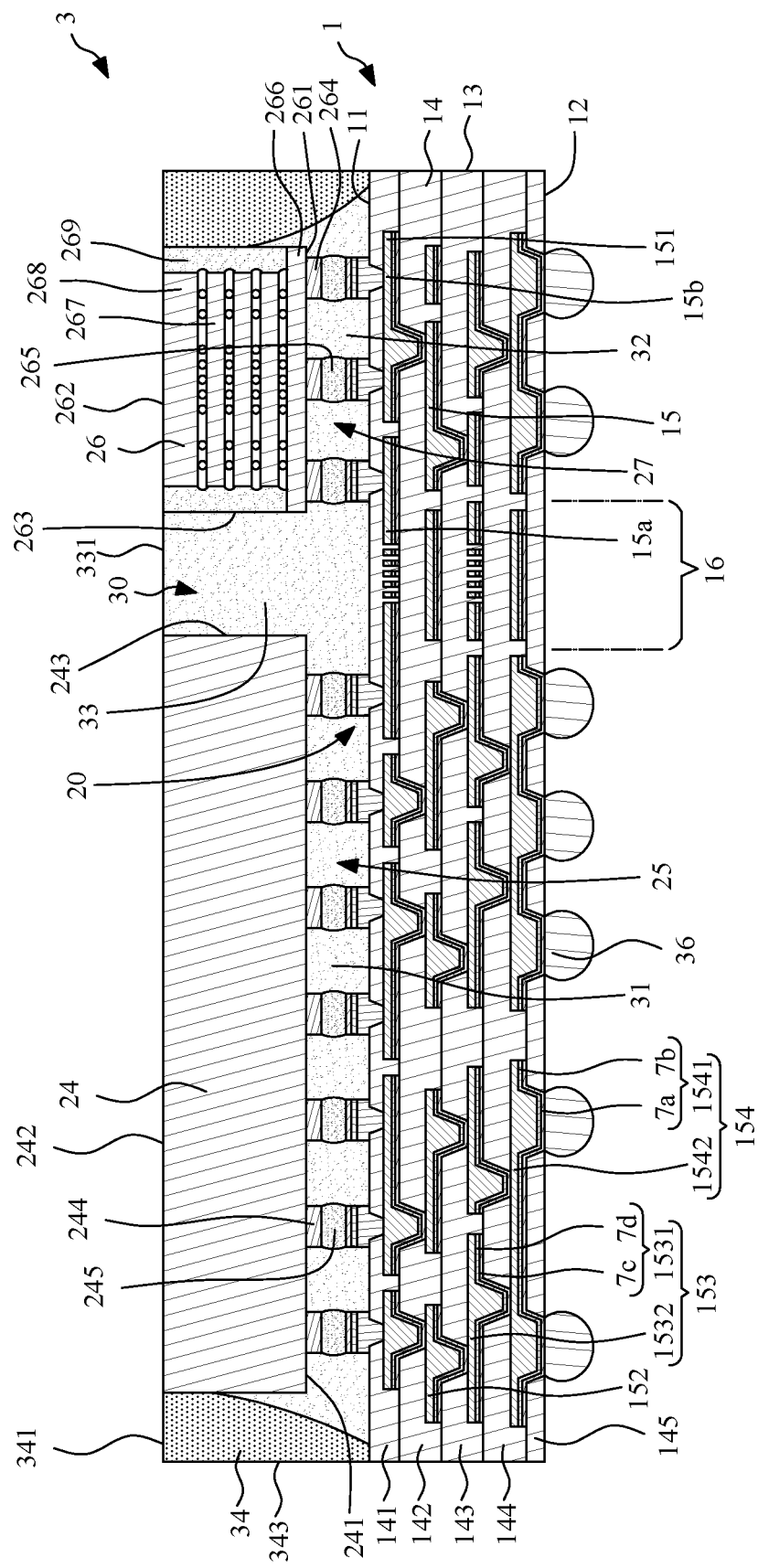
FIG. 3 illustrates a cross-sectional view taken along line 3-3 of the package structure of FIG. 1.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. The package structure 3 includes a wiring structure 1, a first electronic device 24, two second electronic devices 26, 26', a protection material 33 (including, e.g., a first protection material 31 and a second protection material 32), an encapsulant 34 and a plurality of solder materials 36. As shown in FIG. 1, the package structure 3 may include one first electronic device 24 and two second electronic devices 26, 26'. However, the amounts of the first electronic device(s) 24 and the second electronic device(s) 26, 26' are not limited in the present disclosure.

As shown in FIG. 2 and FIG. 3, the wiring structure 1 has a first surface 11 (e.g., a top surface), a second surface 12 (e.g., a bottom surface) opposite to the first surface 11, a lateral surface 13 extending between the first surface 11 and the second surface 12, and a high density region 16 (or a fine line region) between the first electronic device 24 and the second electronic devices 26, 26'. The wiring structure 1 may include at least one dielectric layer 14, at least one circuit layer 15 in contact with the dielectric layer 14, and a plurality of protrusion pads 20. For example, as shown in FIG. 2 and FIG. 3, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154. Each of the circuit layers 15 may be a fan-out circuit layer or a redistribution layer (RDL).

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. In some embodiments, the first circuit layer 151 may include a seed layer and a metal layer disposed on the seed layer. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high line density region 16, and the periphery portion 15b is located outside the high line density region 16 (e.g., at a low line density region). For example, the second electronic devices 26, 26' may be electrically connected to the first electronic device 24 through the interconnection portion 15a of the first circuit layer 151. The second electronic devices 26, 26' and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 µm/about 5 µm, or less than or equal to about 2 µm/about 2 µm, or less than or equal to about 0.8 µm/about 0.8 µm. An L/S of the traces of the periphery portion 15b may be less than or equal to about 10 µm/about 10 µm, or less than or equal to about 7 µm/about 7 µm, or less than or equal to about 5 µm/about 5 µm.

The first dielectric layer 141 and the first circuit layer 151 may be disposed on the second dielectric layer 142. In addition, the second dielectric layer 142 may cover the second circuit layer 152. A portion (i.e., a via portion) of the first circuit layer 151 extends through the second dielectric layer 142 to electrically connect the second circuit layer 152.

A material of the second dielectric layer 142 may be the same as or similar to the material of the first dielectric layer 141. The second circuit layer 152 may also include an interconnection portion located in the high line density region 16, and a periphery portion located outside the high line density region 16. In some embodiments, the via portion of the first circuit layer 151 may extend from the periphery portion, and they may be formed concurrently and integrally. In some embodiments, the second circuit layer 152 may include a seed layer and a metal layer disposed on the seed layer.

Similarly, the second dielectric layer 142 and the second circuit layer 152 may be disposed on the third dielectric layer 143. In addition, the third dielectric layer 143 may cover the third circuit layer 153. A portion (i.e., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high line density region 16, and a periphery portion located outside the high line density region 16. In some embodiments, the via portion of the second circuit layer 152 may extend from the periphery portion, and they may be formed concurrently and integrally. In some embodiments, the third circuit layer 153 may include a seed layer 1531 and a metal layer 1532 disposed on the seed layer 1531. For example, the seed layer 1531 may include a first metal layer 7c (e.g., a titanium (Ti) layer) and a second metal layer 7d (e.g., a copper (Cu) layer). The metal layer 1532 may include a Cu layer.

Similarly, the third dielectric layer 143 and the third circuit layer 153 may be disposed on the fourth dielectric layer 144. In addition, the fourth dielectric layer 144 may cover the fourth circuit layer 154. A portion (i.e., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high line density region 16, and a periphery portion located outside the high line density region 16.

The fourth dielectric layer 144 and the fourth circuit layer 154 may be disposed on the fifth dielectric layer 145. A portion (i.e., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. In some embodiments, the fourth circuit layer 154 may include a seed layer 1541 and a metal layer 1542 disposed on the seed layer 1541. For example, the seed layer 1541 may include a first metal layer 7a (e.g., a Ti layer) and a second metal layer 7b (e.g., a Cu layer). The metal layer 1542 may include a Cu layer.

As shown in FIG. 2 and FIG. 3, the second electronic devices 26, 26' may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic devices 26, 26' and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The protrusion pads 20 may be disposed on and protrude from the first dielectric layer 141 (i.e., the topmost dielectric layer or the outermost dielectric layer) of the wiring structure 1. The protrusion pads 20 may be disposed on and protrude from the first surface 11 of the wiring structure 1, and extend through the first dielectric layer 141 (i.e., the topmost dielectric layer or the outermost dielectric layer) to electrically connect the first circuit layer 151. In some embodiments, there may be a plurality of surface finish layers such as a first metal layer, a second metal layer and a third metal layer sequentially disposed on the top surface of the protrusion pad 20. For example, the first metal layer may include copper, the second metal layer may include nickel, and the third metal layer may include gold.

The first electronic device 24 and the second electronic devices 26, 26' are disposed adjacent to or disposed on the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 1 to FIG. 3, the first electronic device 24 has a first active surface 241 (e.g., bottom surface), a first backside surface 242 (e.g., top surface) and a first lateral side surface 243. The first backside surface 242 is opposite to the first active surface 241. The first lateral side surface 243 extends between the first active surface 241 and the first backside surface 242. The first lateral side surface 243 faces to the second electronic devices 26, 26'.

Further, the first electronic device 24 may include a plurality of electrical contacts 244. The electrical contacts 244 may be disposed adjacent to the first active surface 241. Alternatively, the electrical contacts 244 may be exposed or may protrude from the first active surface 241 for electrical connection. The electrical contacts 244 may be pads, bumps, studs, pillars or posts. In some embodiments, the electrical contacts 244 of the first electronic device 24 may be electrically connected and physically connected to the protrusion pads 20 through a plurality of solder materials 245. In other words, the first electronic device 24 may be electrically connected to the wiring structure 1 by flip-chip bonding.

The second electronic device 26 may be a semiconductor device such as high bandwidth memory (HBM) die. The second electronic device 26 has a second active surface 261 (e.g., bottom surface), a second backside surface 262 (e.g., top surface) and a second lateral side surface 263. The second lateral side surface 263 faces to the first electronic device 24. The second backside surface 262 is opposite to the second active surface 261. The second lateral side surface 263 extends between the second active surface 261 and the second backside surface 262.

Further, the second electronic device 26 may include a plurality of electrical contacts 264 disposed adjacent to the second active surface 261. The electrical contacts 264 may be exposed or may protrude from the second active surface 261 for electrical connection. The electrical contacts 264 may be pads, bumps, studs, pillars or posts. In some embodiments, the electrical contacts 264 of the second electronic device 26 may be electrically connected and bonded to the protrusion pads 20 through a plurality of solder materials 265. In other words, the second electronic device 26 may be bonded to the wiring structure 1 by flip-chip bonding. As shown in FIG. 2 and FIG. 3, the second electronic device 26 may include a logic die 266, a plurality of memory dice 267, a top die 268 and a package body 269 (e.g., a molding compound). The top die 268 and the memory dice 267 may be stacked on a top surface of the logic die 266. The package body 269 may encapsulate the top die 268 and the memory dice 267, and may cover a portion of the top surface of the logic die 266.

As shown in FIG. 2 and FIG. 3, a central gap 30 is formed between the first lateral side surface 243 of the first electronic device 24 and the second lateral side surface 263 of the second electronic device 26. A width G of the central gap 30 may be defined as a minimum distance between the first lateral side surface 243 of the first electronic device 24 and the second lateral side surface 263 of the second electronic device 26. The width G of the central gap 30 may be less than or equal to about 100 μm, less than or equal to about 70 μm, or less than or equal to about 50 μm.

As shown in FIG. 2 and FIG. 3, the first protection material 31 may be an underfill that is disposed in a first space 25 between the first electronic device 24 and the wiring structure 1 so as to cover and protect the joints formed by the electrical contacts 244, the protrusion pads 20 and the solder materials 245. Further, the second protection material 32 may be an underfill that is disposed in a second space 27 between the second electronic device 26 and the wiring structure 1 so as to cover and protect the joints formed by the electrical contacts 264, the protrusion pads 20 and the solder materials 265. As shown in FIG. 2 and FIG. 3, the first protection material 31 and the second protection material 32 may be merged together and may be portions of the protection material 33. However, in other embodiments, the first protection material 31 and the second protection material 32 may be separated from each other. In addition, a portion of the protection material 33 may further extend into the central gap 30.

The encapsulant 34 may cover at least a portion of the first electronic device 24, at least a portion of the second electronic device(s) 26, 26', the protection material 33 and a portion of the first surface 11 of the wiring structure 1. A material of the encapsulant 34 may be a molding compound with or without fillers. The encapsulant 34 has a first surface 341 (e.g., a top surface) and a lateral surface 343. As shown in FIG. 2 and FIG. 3, the first surface 341 of the encapsulant 34, a top surface 331 of the protection material 33 in the central gap 30, the first backside surface 242 of the first electronic device 24 and the second backside surface 262 of the second electronic device 26 may be substantially coplanar with each other. In some embodiments, the top surface 331 of the protection material 33 in the central gap 30 may be recessed from the first backside surface 242 of the first electronic device 24 and/or the second backside surface 262 of the second electronic device 26. Thus, a portion of the encapsulant 34 may extend into the central gap 30. In addition, the lateral surface 343 of the encapsulant 34 may be substantially coplanar with the lateral surface 13 of the wiring structure 1.

The solder materials 36 (e.g., solder balls) may be disposed adjacent to the second surface 12 of the wiring structure 1 for external connection. As shown in FIG. 2 and FIG. 3, the solder materials 36 are disposed on the exposed portions (i.e., the bottom portions of the via portions) of the fourth circuit layer 154.

Figure 4:
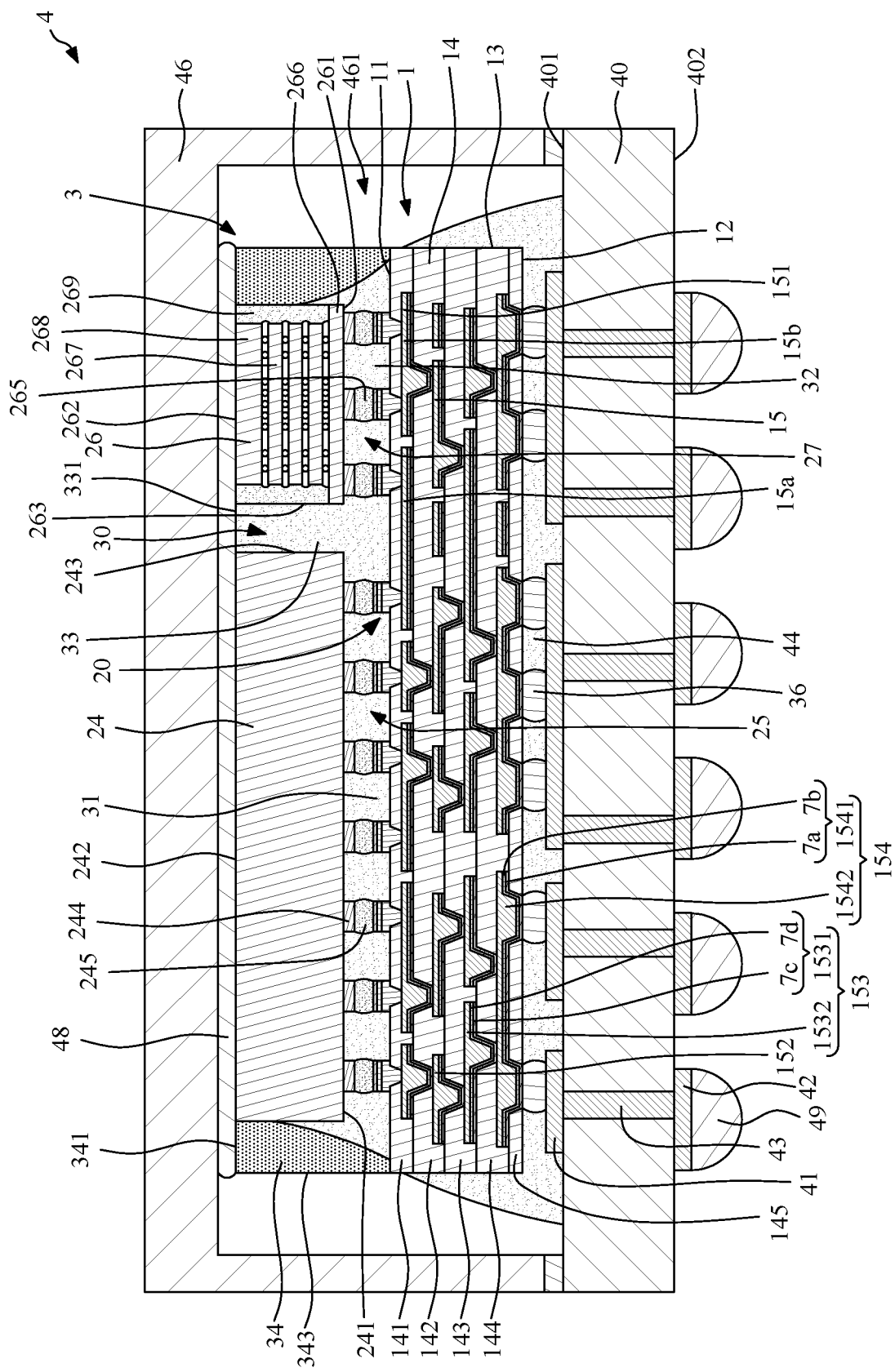
FIG. 4 illustrates a cross-sectional view of an assembly structure according to some embodiments of the present disclosure.

FIG. 4 illustrates a cross-sectional view of an assembly structure 4 according to some embodiments of the present disclosure. The assembly structure 4 may be a semiconductor package structure, and may include a base substrate 40, a package structure 3, a heat sink 46 and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 4, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 4 may be same as or similar to the package structure 3 of FIG. 1 to FIG. 3. The package structure 3 may be electrically connected to the first circuit layer 41 of the base substrate 40 through the solder materials 36. A protection material 44 (i.e., an underfill) may be further included in a space between the package structure 3 and the base substrate 40 so as to cover and protect the solder materials 36 and the first circuit layer 41. Further, the heat sink 46 may be a cap structure or a hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic devices 26, 26'. Another portion (e.g., bottom portion) of the heat sink 46 may be attached to the first surface 401 of the base substrate 40 through an adhesive material. In addition, the external connectors 49 (e.g., solder balls) are formed or disposed on the second circuit layer 42 for external connection.

FIG. 5 through FIG. 23 illustrate a method for manufacturing an assembly structure according to some embodiments of the present disclosure. In some embodiments, the method is for manufacturing the package structure 3 shown in FIG. 1 to FIG. 3, and the assembly structure 4 shown in FIG. 4.

Figure 5:
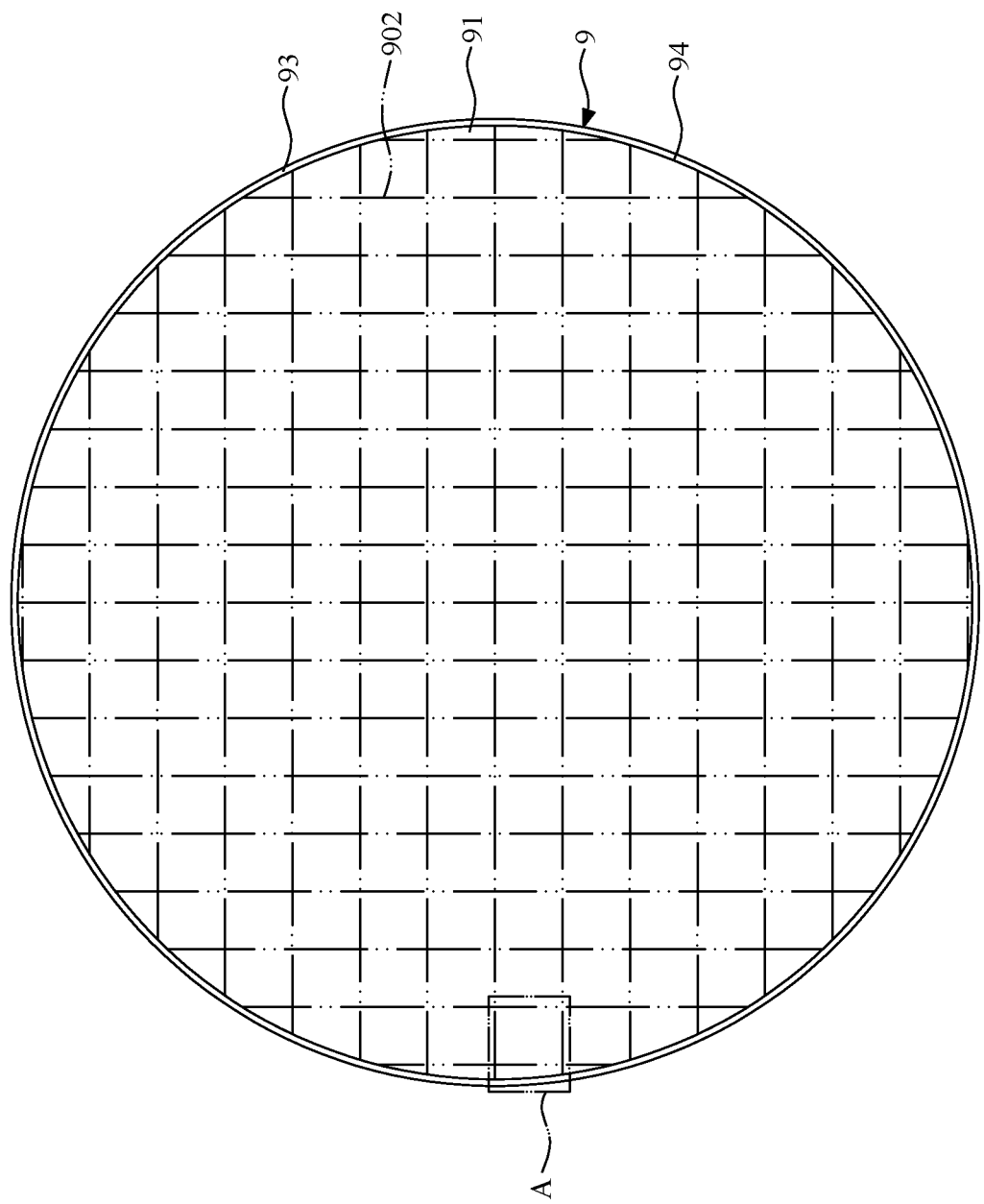
FIG. 5 illustrates one or more stages of an example of a method for manufacturing an assembly structure according to some embodiments of the present disclosure.
Figure 6:
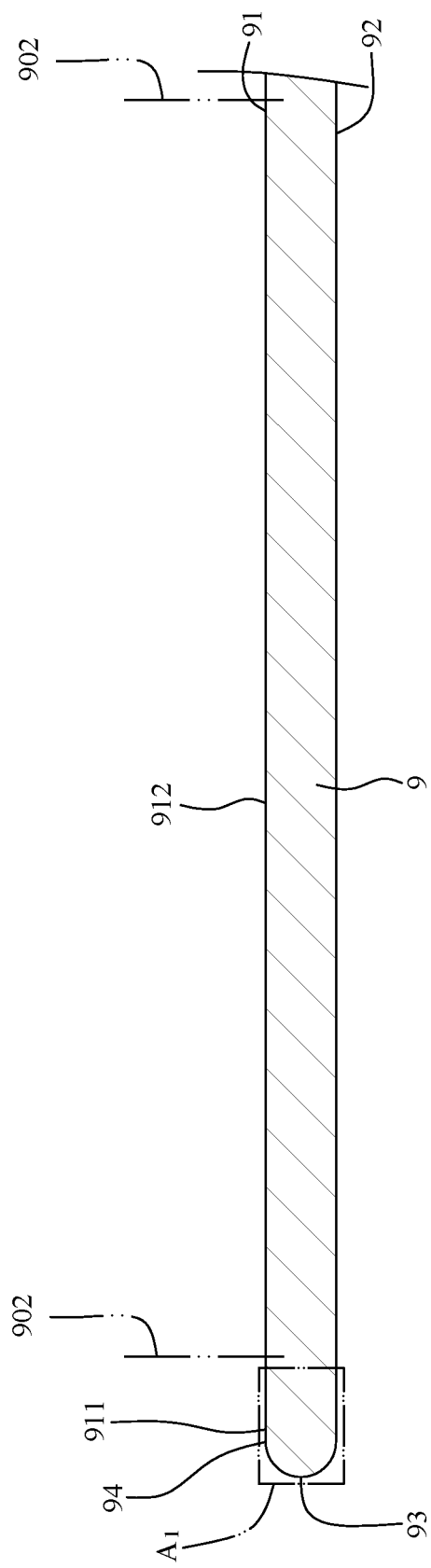
FIG. 6 illustrates one or more stages of an example of a method for manufacturing an assembly structure according to some embodiments of the present disclosure.

Referring to FIG. 5 and FIG. 6, wherein FIG. 6 illustrates an enlarged cross-sectional view of a region "A" of FIG. 5, a carrier 9 is provided. The carrier 9 may be in a wafer type, a strip type or a panel type. For example, the carrier 9 may be a glass carrier. In some embodiments, the carrier 9 may have a top surface 91, a bottom surface 92 opposite to the top surface 91 and a lateral side surface 93 extending between the top surface 91 and the bottom surface 92. The lateral side surface 93 connects the top surface 91 and is non-parallel with the top surface 91. The lateral side surface 93 of the carrier 9 may be a curved surface. Further, the carrier 9 may have a circumference edge 94 that is an intersection between the top surface 91 and the lateral side surface 93. Thus, the circumference edge 94 is disposed at a corner of the carrier 9. In some embodiments, there may be a plurality of predetermined cutting lines 902 on the carrier 9. The predetermined cutting lines 902 may be imaginary, and may define a plurality of unit areas.

Figure 6A:
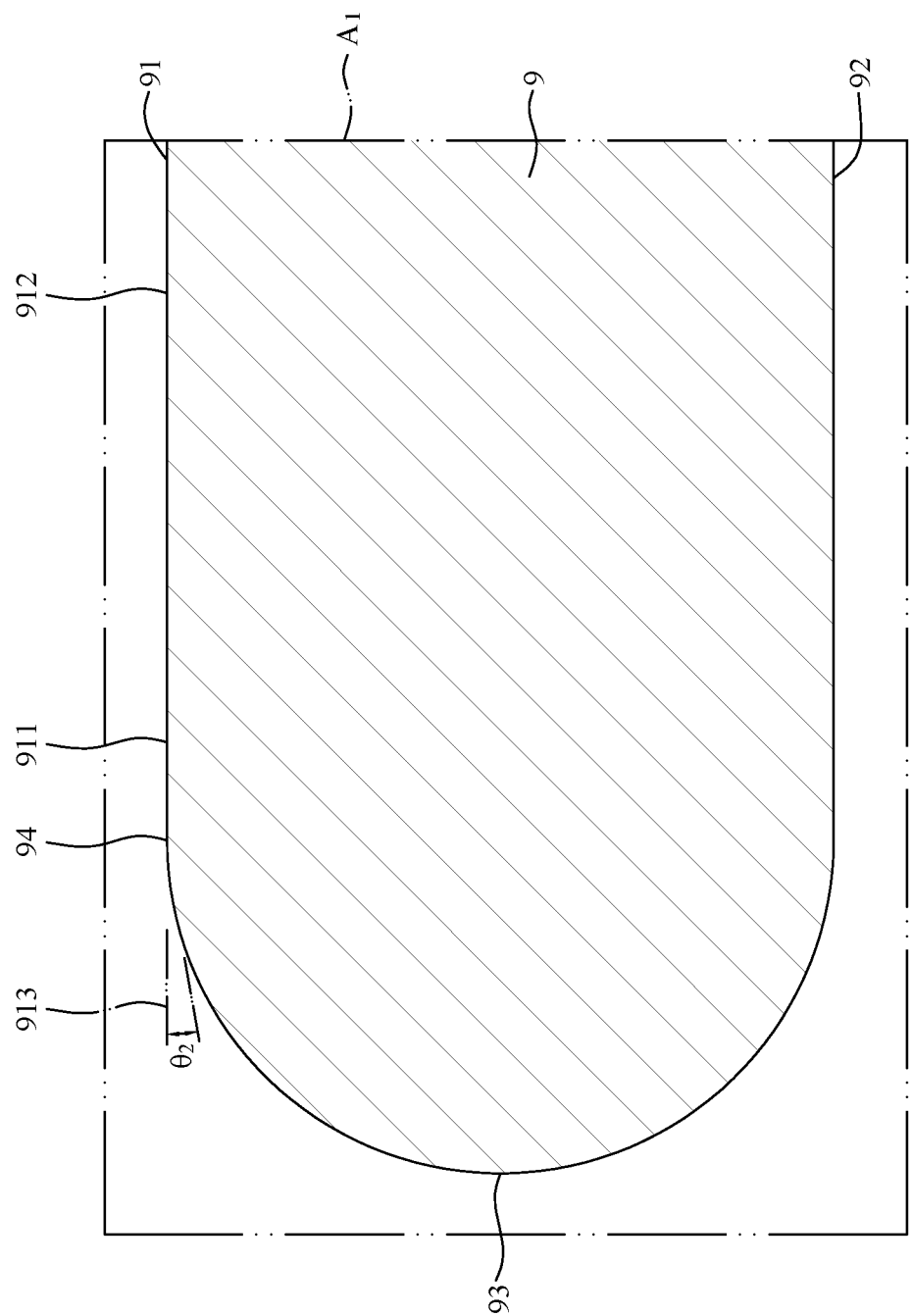
FIG. 6A illustrates an enlarged view of a region "Ai" of FIG. 6.

FIG. 6A illustrates an enlarged view of a region "Ai" of FIG. 6. The top surface 91 of the carrier 9 may include a main portion 912 and a flat portion 911 (e.g., a peripheral portion). The flat portion 911 surrounds the main portion 912, and connects the lateral side surface 93. A first included angle $\theta_1$ is defined as an angle between an imaginary surface 913 extending from the main portion 912 and the flat portion 911. A second included angle $\theta_2$ is defined as an angle between the imaginary surface 913 extending from the main portion 912 and the lateral side surface 93. The first included angle $\theta_1$ is less than the second included angle $\theta_2$. As shown in FIG. 6A, the flat portion 911 is substantially coplanar with the main portion 912, thus, the first included angle $\theta_1$ may be zero degree or may be very close to zero degree.

Figure 6B:
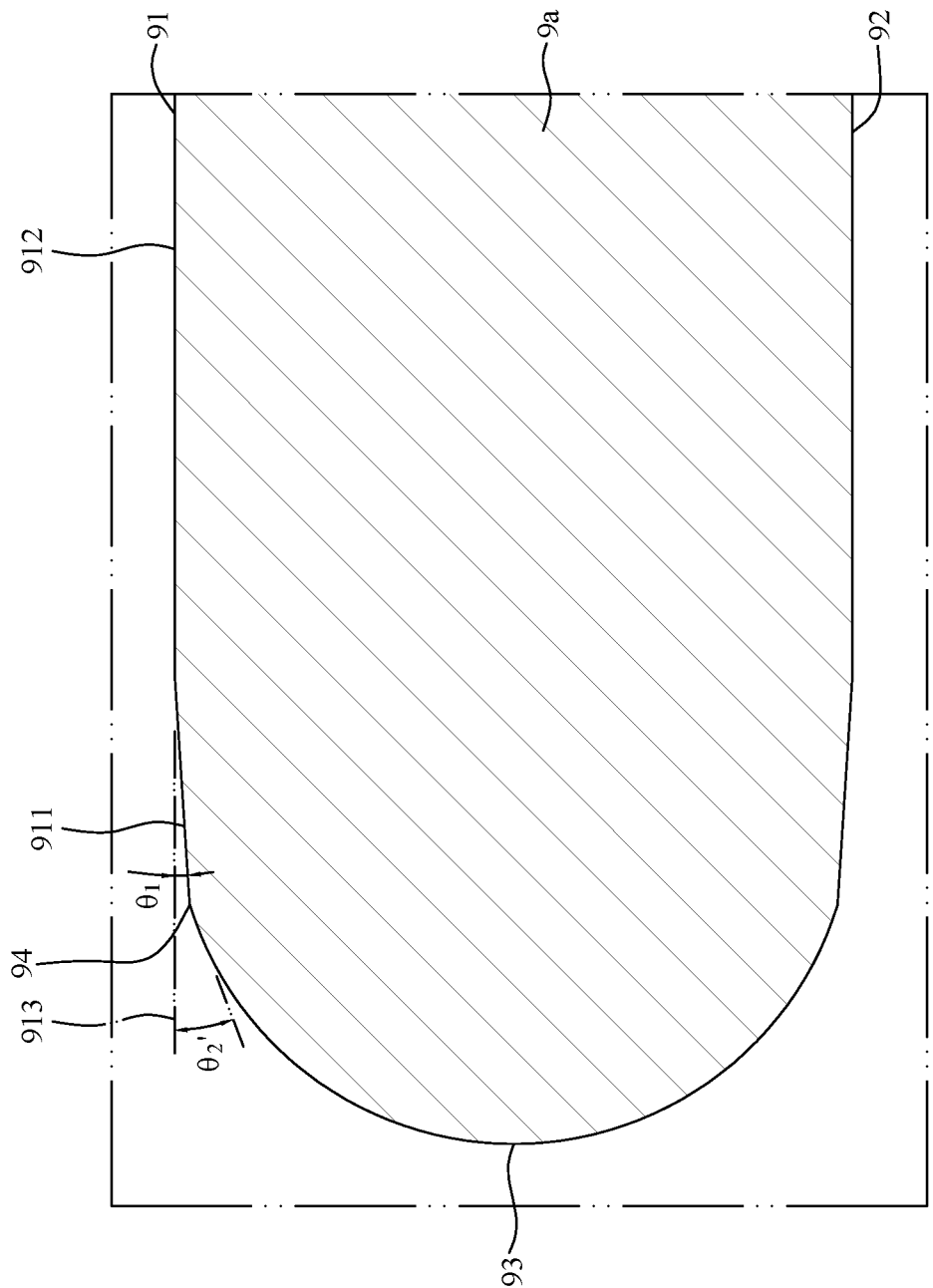
FIG. 6B illustrates a cross-sectional view of a carrier according to some embodiments of the present disclosure.

FIG. 6B illustrates a cross-sectional view of a carrier 9a according to some embodiments of the present disclosure. The carrier 9a of FIG. 6B is similar to the carrier 9 of FIG. 6A, except that the first included angle $\theta_1$ is greater than zero degree. That is, the flat portion 911 is not coplanar with the main portion 912. In addition, the second included angle $\theta_2'$ of FIG. 6B is greater than the second included angle $\theta_2$ of FIG. 6A.

Figure 6C:
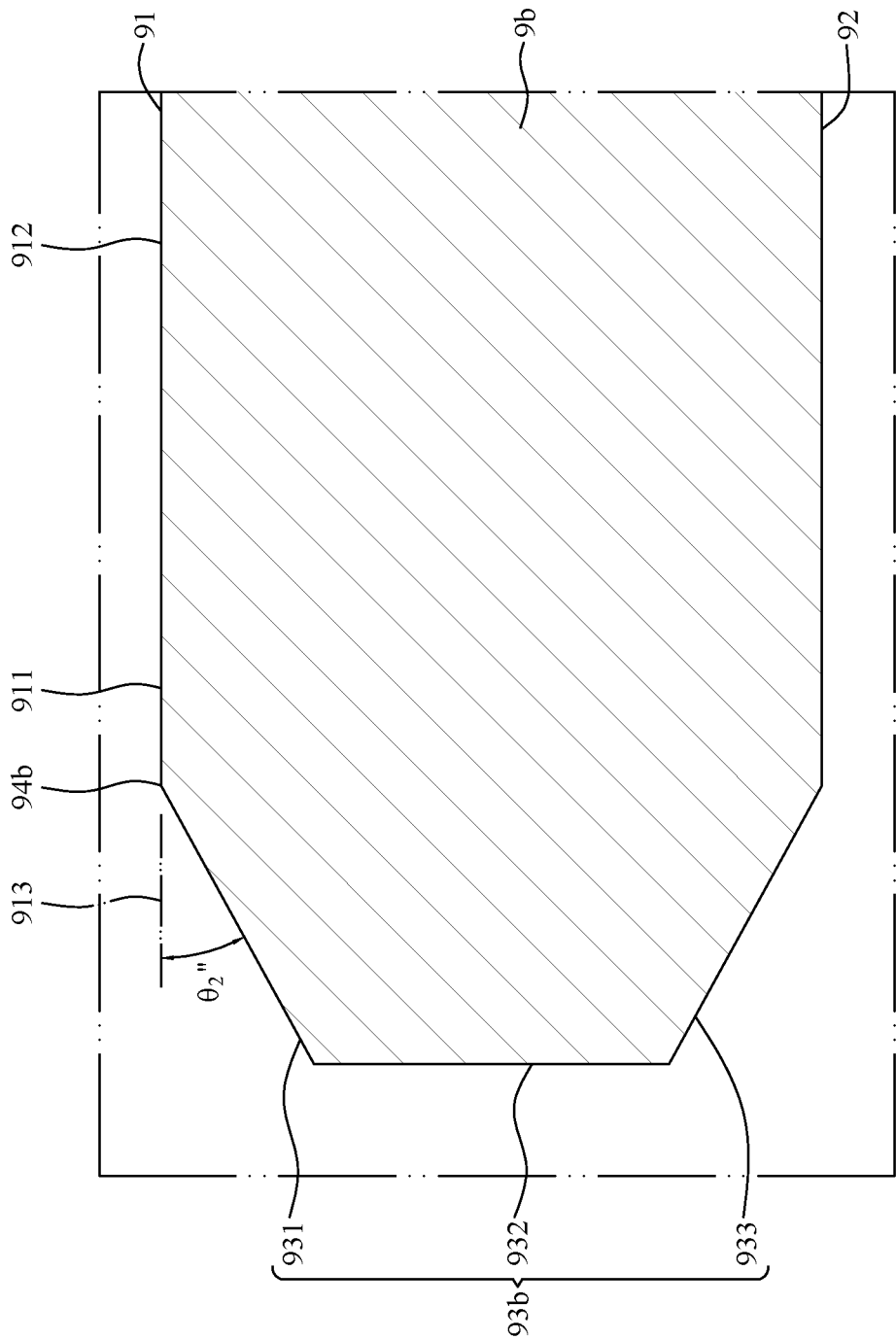
FIG. 6C illustrates a cross-sectional view of a carrier according to some embodiments of the present disclosure.

FIG. 6C illustrates a cross-sectional view of a carrier 9b according to some embodiments of the present disclosure. The carrier 9b of FIG. 6C is similar to the carrier 9 of FIG. 6A, except that the lateral side surface 93b of the carrier 9b may include three flat surfaces 931, 932, 933. The second included angle $\theta_2''$ is defined as an angle between the imaginary surface 913 extending from the main portion 912 and the flat surface 931 of the lateral side surface 93b. In addition, the second included angle $\theta_2''$ of FIG. 6C may be greater than the second included angle $\theta_2'$ of FIG. 6B.

Figure 7:
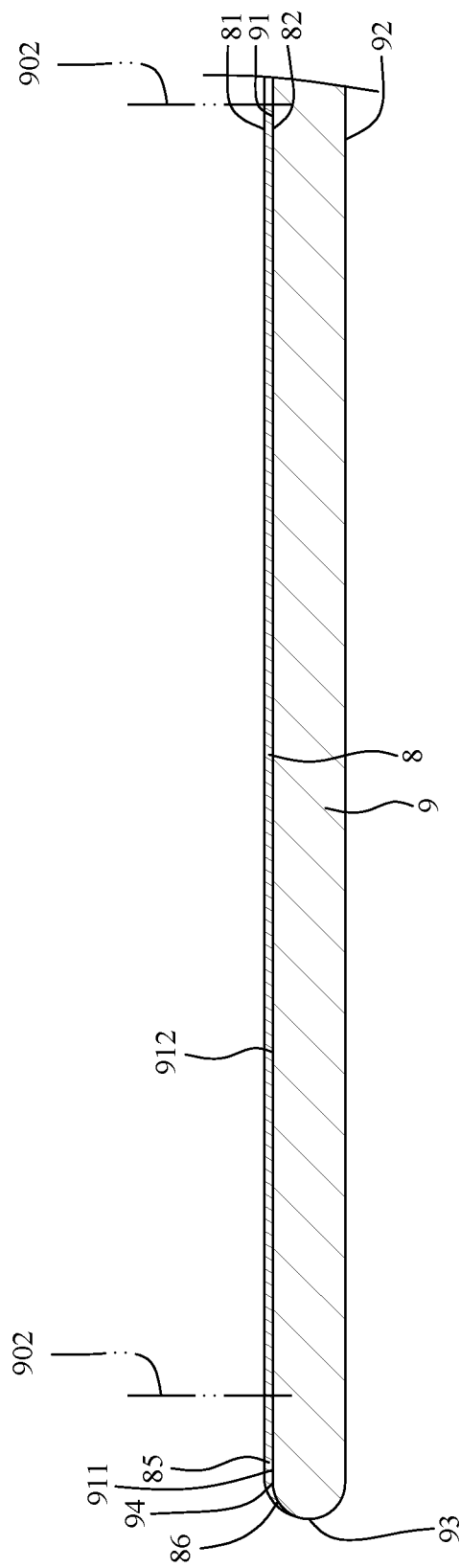
FIG. 7 illustrates one or more stages of an example of a method for manufacturing an assembly structure according to some embodiments of the present disclosure.

Referring to FIG. 7, an under layer 8 (e.g., a release film or a release layer) is formed on the top surface 91 of the carrier 9 by, for example, spin coating, chemical vapor deposition or adhesion. In some embodiments, the under layer 8 may cover the entire top surface 91 of the carrier 9. In some embodiments, the under layer 8 may have a top surface 81, a bottom surface 82 opposite to the top surface 81 and an extending portion 86 extending to the lateral side surface 93 of the carrier 9. In some embodiments, the under layer 8 may include a first peripheral portion 85 disposed on the flat portion 911 (e.g., a peripheral portion) of the top surface 91 of the carrier 9.

Figure 8:
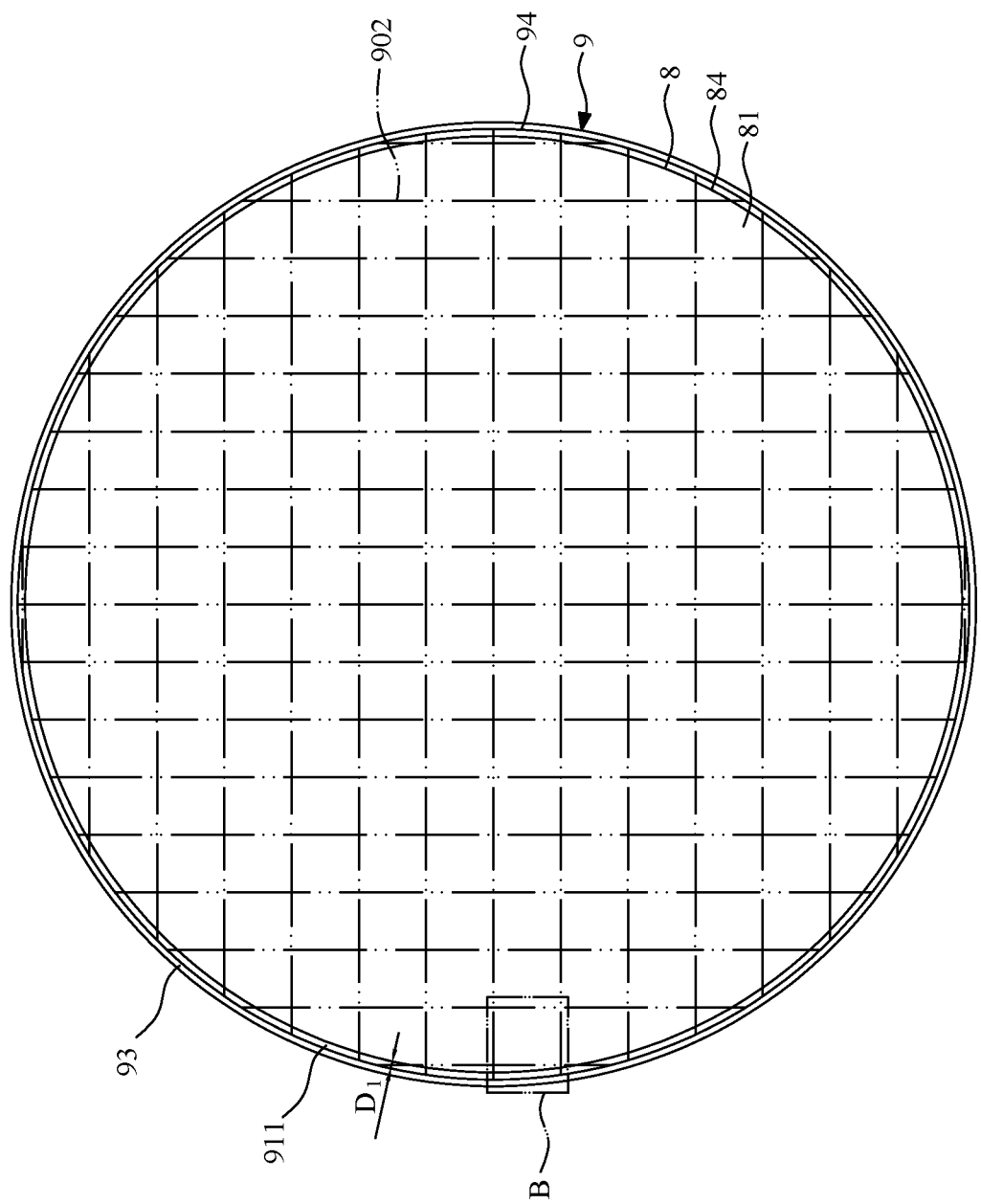
FIG. 8 illustrates one or more stages of an example of a method for manufacturing an assembly structure according to some embodiments of the present disclosure.
Figure 9:
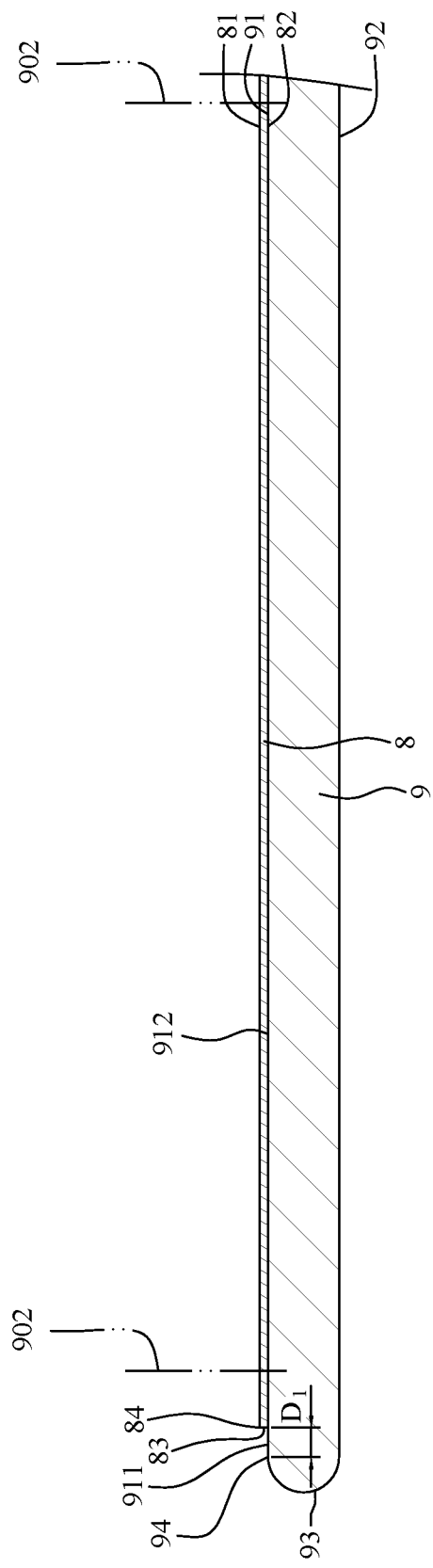
FIG. 9 illustrates one or more stages of an example of a method for manufacturing an assembly structure according to some embodiments of the present disclosure.

Referring to FIG. 8 and FIG. 9, wherein FIG. 9 illustrates an enlarged cross-sectional view of a region "B" of FIG. 8, the first peripheral portion 85 of the under layer 8 may be removed so as to at least partially expose the flat portion 911 of the top surface 91 of the carrier 9. Thus, the under layer 8 exposes the peripheral portion of the top surface 91 to define the flat portion 911 connecting the lateral side surface 93. In some embodiments, the extending portion 86 of the under layer 8 may be removed concurrently. Meanwhile, a size (e.g., a width or a diameter) of the under layer 8 is less than a size (e.g., a width or a diameter) of the carrier 9. In some embodiments, the first peripheral portion 85 of the under layer 8 may be removed by edge bead removal (EBR) process, such as laser etching or chemical development process (i.e., chemical solvent). As shown in FIG. 8, the under layer 8 is disposed within an area defined by the circumference edge 94 of the carrier 9. As shown in FIG. 9, the under layer 8 may have a lateral side surface 83 extending between the top surface 81 and the bottom surface 82. Further, the under layer 8 may have a circumference edge 84 that is an intersection between the top surface 81 and the lateral side surface 83. Thus, the circumference edge 84 is disposed at a corner of the under layer 8. A distance (or a gap) $D_1$ between the circumference edge 84 of the under layer 8 and the circumference edge 94 of the carrier 9 may be greater than 0.1 mm and less than 0.5 mm. The distance (or a gap) $D_1$ may be a distance between the lateral side surface 83 of the under layer 8 and the circumference edge 94 of the carrier 9. It is noted that the distance (or a gap) $D_1$ may correspond to or equal to a width of the removed first peripheral portion 85 of the under layer 8.

Figure 9A:
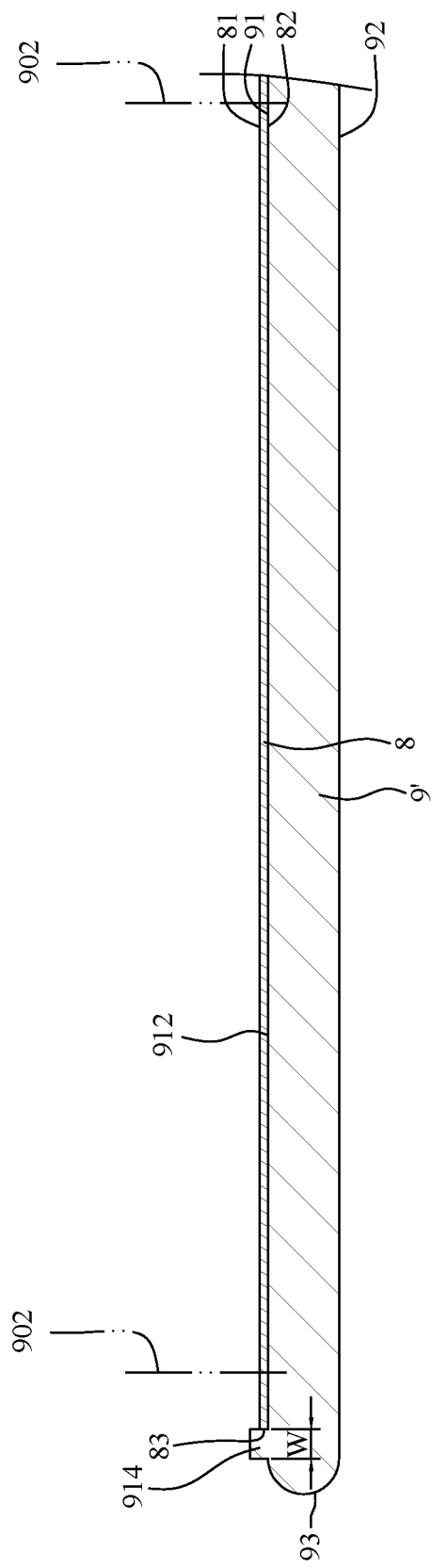
FIG. 9A illustrates another example of FIG. 9.

FIG. 9A illustrates another example of FIG. 9. As shown in FIG. 9, the carrier 9' may include a protrusion portion 914 surrounding the main portion 912 of the top surface 91 of the carrier 9'. A width W of the protrusion portion 914 may be equal to the distance (or a gap) $D_1$ of FIG. 9. A height of the protrusion portion 914 may be equal to or greater than a thickness of the the under layer 8 so as to limit and protect the under layer 8.

Figure 10:
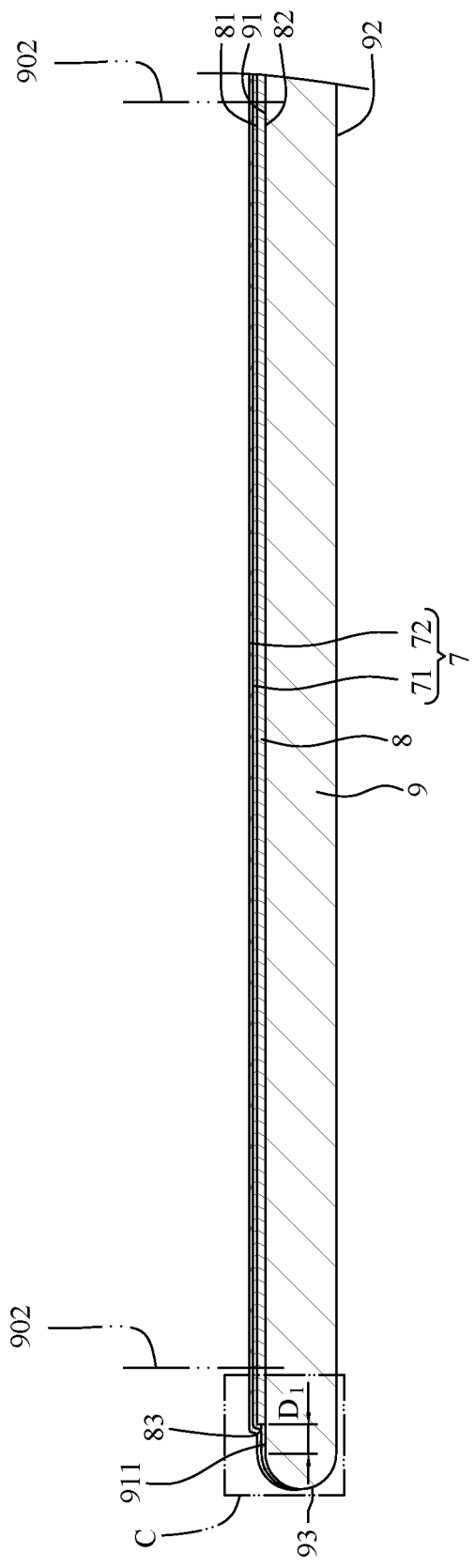
FIG. 10 illustrates one or more stages of an example of a method for manufacturing an assembly structure according to some embodiments of the present disclosure.
Figure 10A:
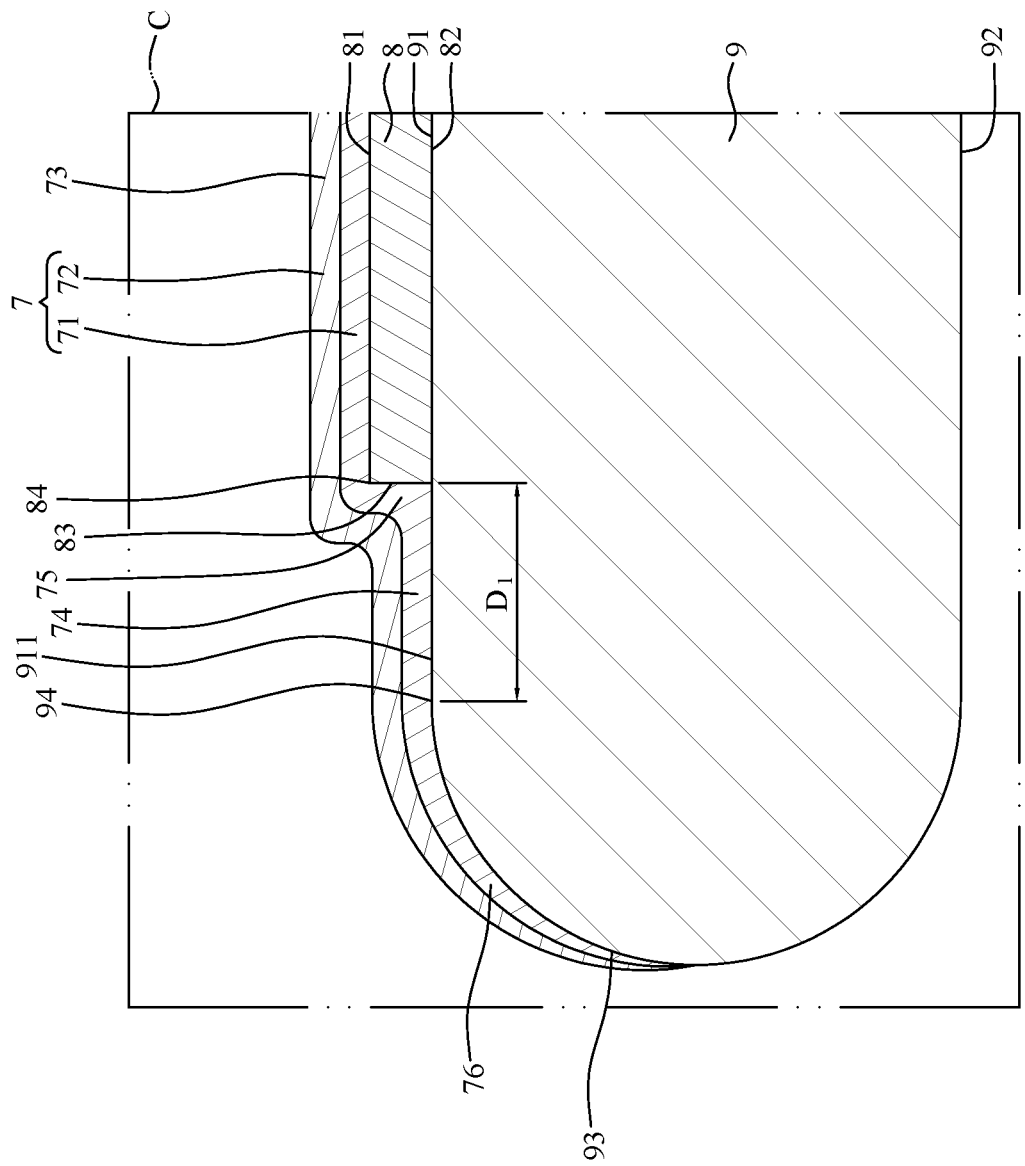
FIG. 10A illustrates an enlarged cross-sectional view of a region "C" of FIG. 10.

Referring to FIG. 10 and FIG. 10A, wherein FIG. 10A illustrates an enlarged cross-sectional view of a region "C" of FIG. 10, a seed layer 7 (also referred to as "a first seed layer") is formed on the under layer 8 by, for example, physical vapor deposition (PVD). In some embodiments, the seed layer 7 may cover and contact the entire top surface 81 of the under layer 8, the lateral side surface 83 of the under layer 8, the exposed flat portion 911 of the top surface 91 of the carrier 9 and the lateral side surface 93 of the carrier 9. In some embodiments, the seed layer 7 may be a single layer structure or a multilayer structure. For example, the seed layer 7 may include a first metal layer 71 (e.g., a titanium (Ti) layer) and a second metal layer 72 (e.g., a copper (Cu) layer). The first metal layer 71 (e.g., Ti layer) may be formed on the entire top surface 81 of the under layer 8, the lateral side surface 83 of the under layer 8, the exposed flat portion 911 of the top surface 91 of the carrier 9, and the lateral side surface 93 of the carrier 9. The second metal layer 72 (e.g., Cu layer) may be formed on the first metal layer 71 (e.g., Ti layer).

As shown in FIG. 10A, the seed layer 7 may include a main portion 73, a peripheral portion 74, a connecting portion 75 and an extending portion 76. The main portion 73 is disposed on the top surface 81 of under layer 8. The peripheral portion 74 is disposed on and contact the exposed flat portion 911 of the carrier 9. The connecting portion 75 extends between the main portion 73 and the peripheral portion 74. The connecting portion 75 is disposed on the lateral side surface 83 of the under layer 8 so as to enclose the under layer 8. The extending portion 76 is disposed on the lateral side surface 93 of the carrier 9. An elevation of the peripheral portion 74 of the seed layer 7 is lower than an elevation of the main portion 73 of the seed layer 7.

Figure 11:
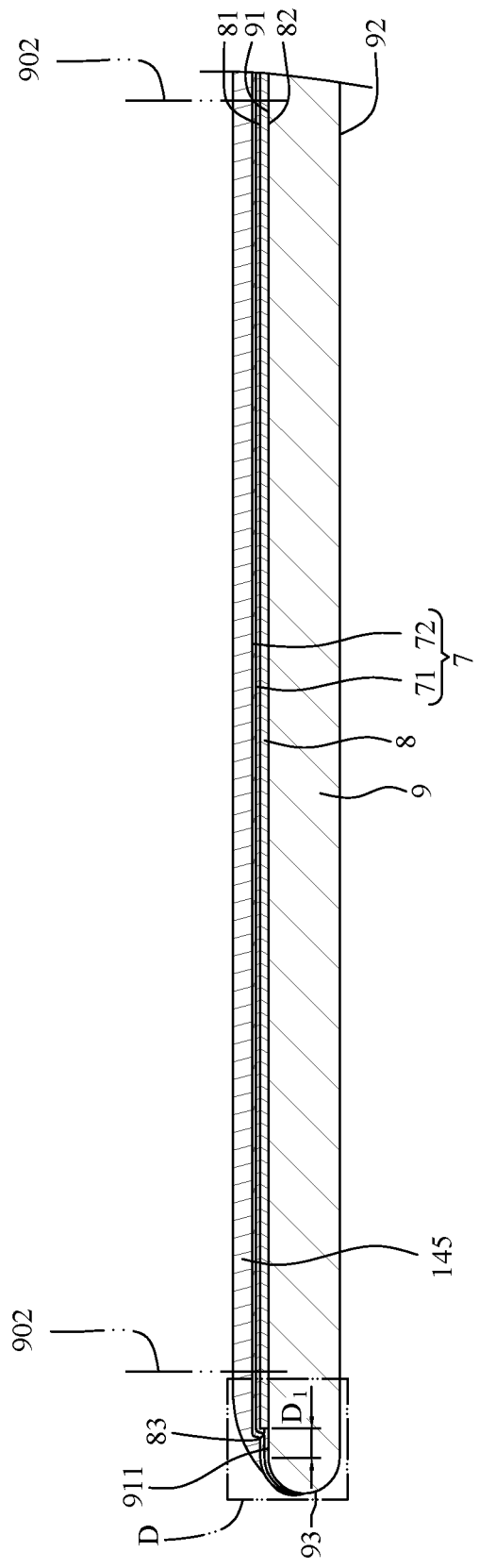
FIG. 11 illustrates one or more stages of an example of a method for manufacturing an assembly structure according to some embodiments of the present disclosure.
Figure 11A:
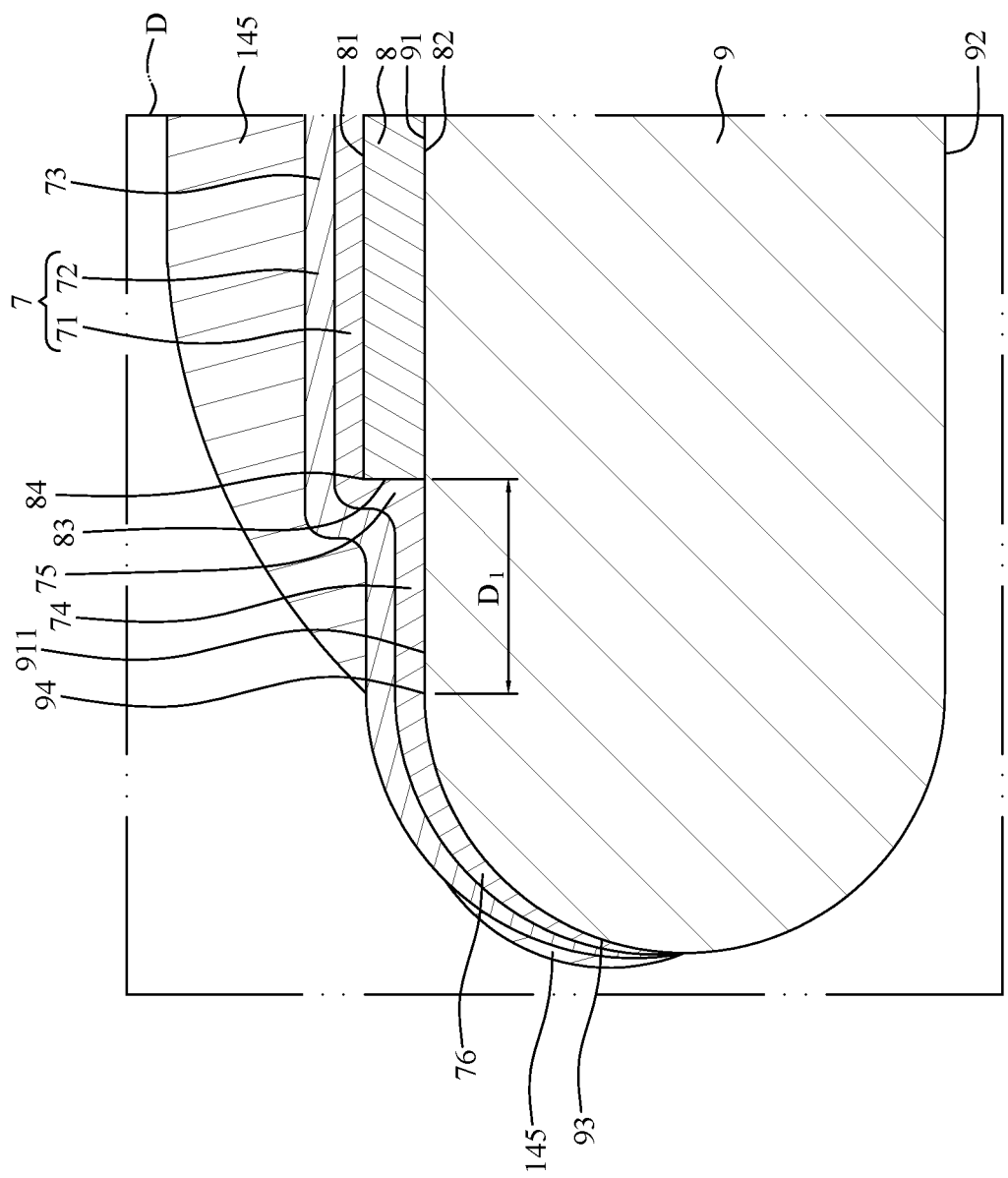
FIG. 11A illustrates an enlarged cross-sectional view of a region "D" of FIG. 11.
Figure 11B:
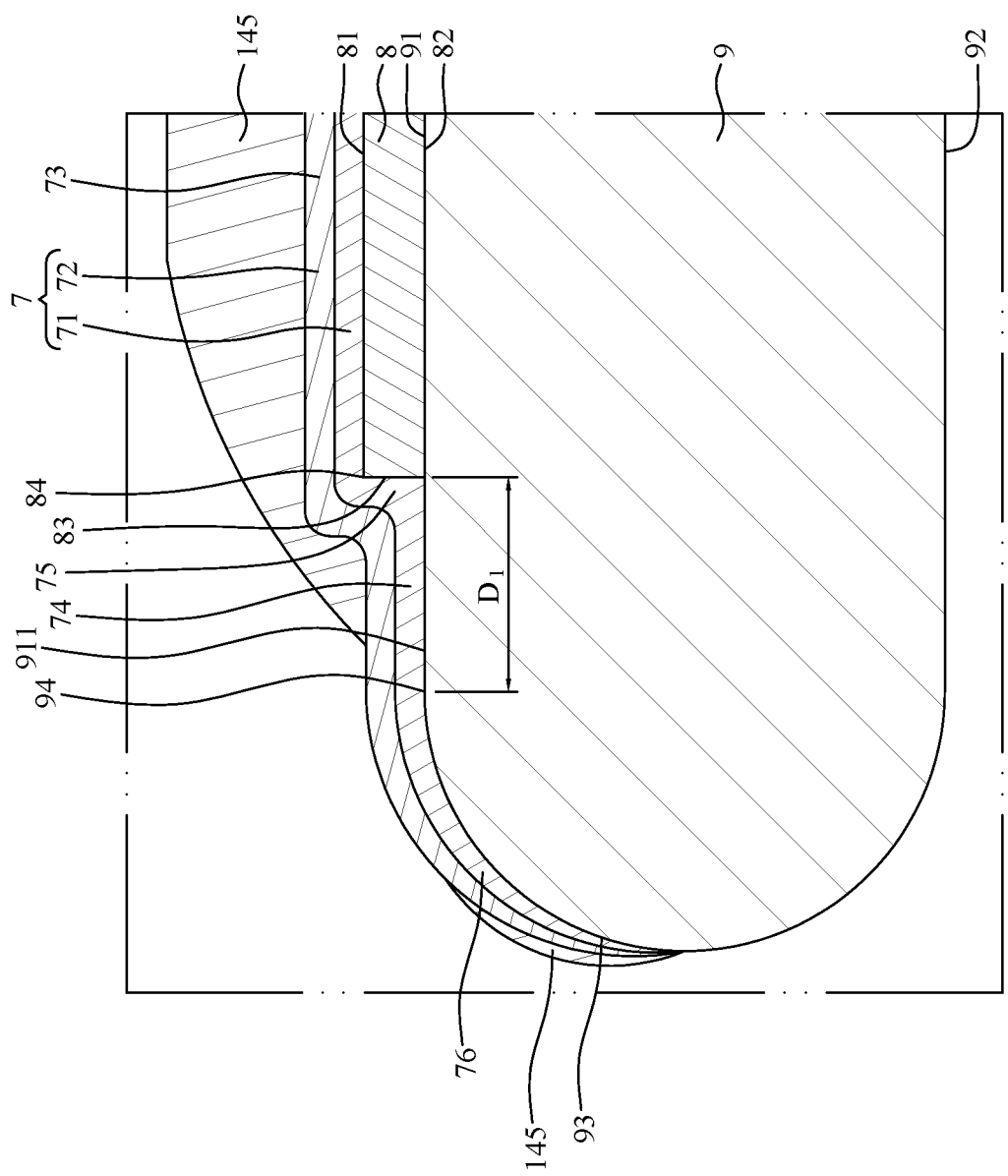
FIG. 11B illustrates another example of FIG. 11A.

Referring to FIG. 11 to FIG. 17, a circuit structure 1' (e.g., a wiring structure 1') is formed on the seed layer 7 as follows. Referring to FIG. 11 and FIG. 11A, wherein FIG. 11A illustrates an enlarged cross-sectional view of a region "D" of FIG. 11, a material (e.g., a fifth dielectric layer 145 (i.e., a bottommost dielectric layer)) in a flowable state is formed on the seed layer 7 through, for example, coating such as spin-coating. It is noted that the formation of such material (e.g., the fifth dielectric layer 145) may include coating or other suitable technique. The flowable material (e.g., the fifth dielectric layer 145) may cover and contact the seed layer 7 on the under layer 8, and may cover the flat portion 911 of the carrier 9. In some embodiments, the material (e.g., the fifth dielectric layer 145) may be in a liquid state. Since sagging of the fifth dielectric layer 145 may occur at the circumference edge 94 of the carrier 9 or on the exposed flat portion 911 of the top surface 91 of the carrier 9, the periphery portion of the fifth dielectric layer 145 that covers the extending portion 76 and the peripheral portion 74 of the seed layer 7 may be very thin. In a worst case, there may be no dielectric material to cover the extending portion 76 and the peripheral portion 74 of the seed layer 7. The fifth dielectric layer 145 may not cover the seed layer 7 completely. Thus, a portion of the extending portion 76 and a portion of the peripheral portion 74 of the seed layer 7 may be exposed from the fifth dielectric layer 145, as shown in FIG. 11B.

Figure 12:
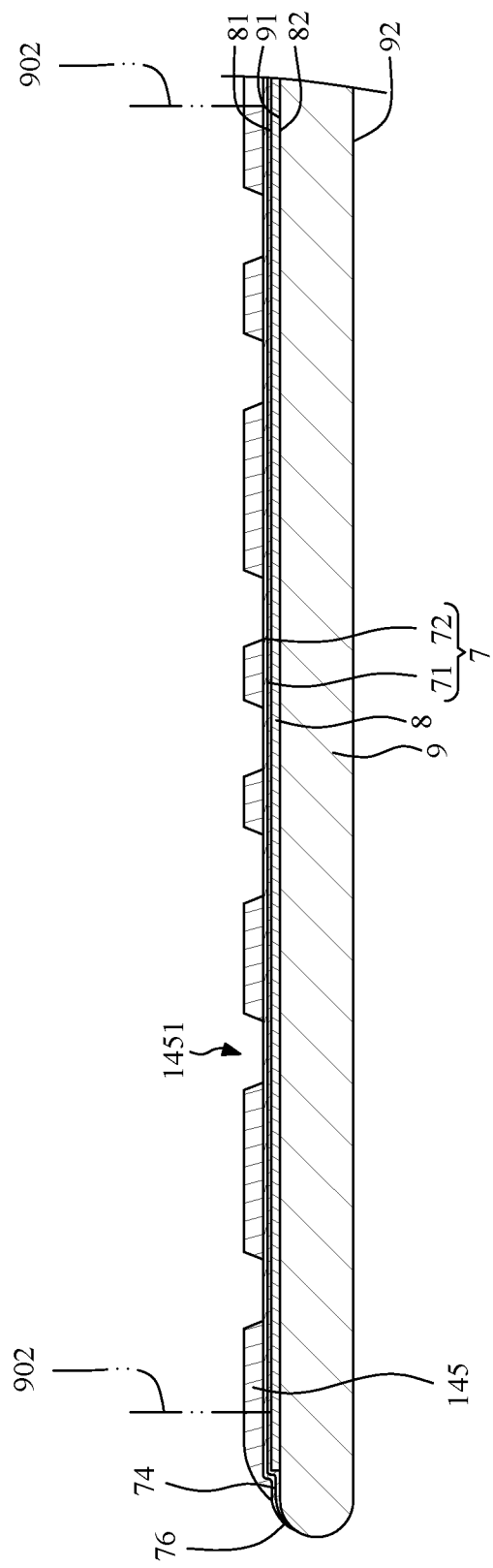
FIG. 12 illustrates one or more stages of an example of a method for manufacturing an assembly structure according to some embodiments of the present disclosure.

Referring to FIG. 12, the material is cured to form the fifth dielectric layer 145. Then, a plurality of through holes 1451 may be formed in the fifth dielectric layer 145 by using a developer. The through holes 1451 may extend through the fifth dielectric layer 145 to expose portions of the seed layer 7.

Figure 13:
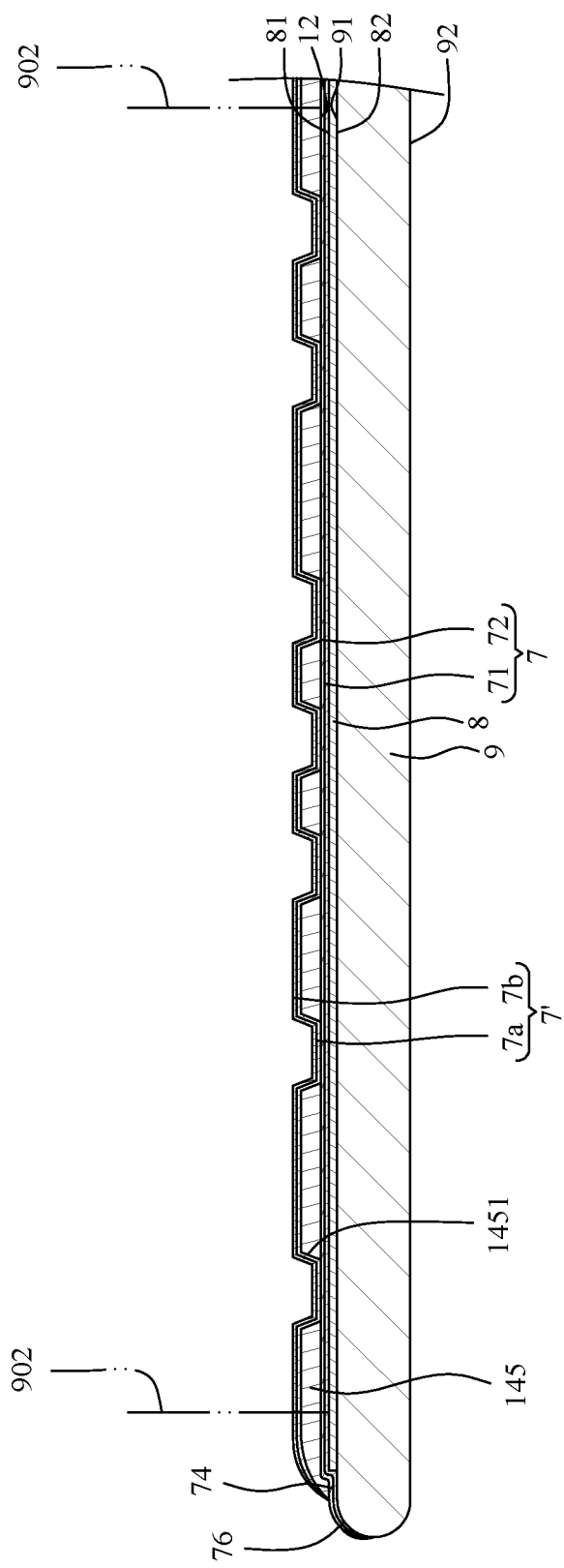
FIG. 13 illustrates one or more stages of an example of a method for manufacturing an assembly structure according to some embodiments of the present disclosure.

Referring to FIG. 13, a seed layer 7' (also referred to as "a second seed layer") is formed on the fifth dielectric layer 145 and in the through holes 1451 to contact the exposed portions of the seed layer 7. In some embodiments, the seed layer 7' may be a single layer structure or a multilayer structure. For example, the seed layer 7' may include a first metal layer 7a (e.g., a Ti layer) and a second metal layer 7b (e.g., a Cu layer). The first metal layer 7a may be formed on the fifth dielectric layer 145 and in the through holes 1451. The second metal layer 7b may be formed on the first metal layer 7b. A material of the seed layer 7' may be same as or different from a material of the seed layer 7.

Figure 14:
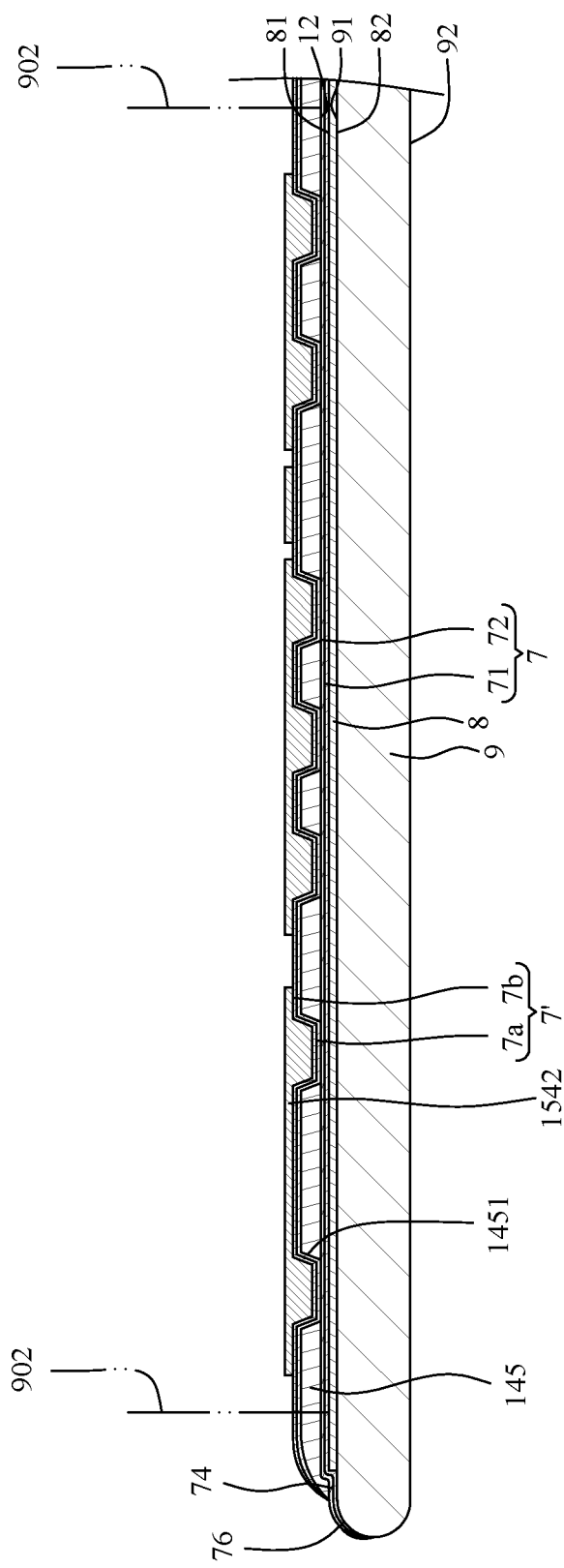
FIG. 14 illustrates one or more stages of an example of a method for manufacturing an assembly structure according to some embodiments of the present disclosure.

Referring to FIG. 14, a patterned metal layer 1542 (e.g., a Cu layer) is formed on the seed layer 7' through electroplating. Meanwhile, the patterned metal layer 1542 and the seed layer 7' (including the first metal layer 7a and the second metal layer 7b) may be referred to as a conductive layer formed on the fifth dielectric layer 145. A portion of the conductive layer is disposed in the through holes 1451 to contact the seed layer 7'.

Figure 15:
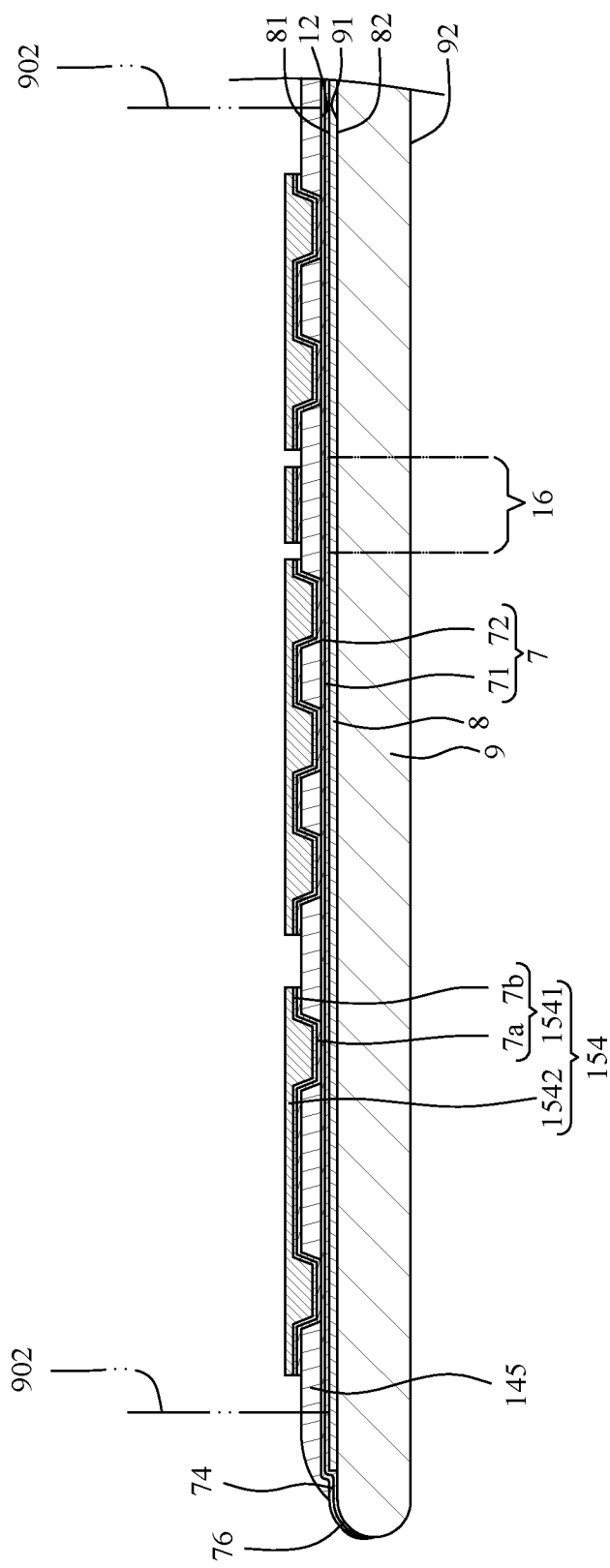
FIG. 15 illustrates one or more stages of an example of a method for manufacturing an assembly structure according to some embodiments of the present disclosure.

Referring to FIG. 15, at least one etchant may be used or applied to the conductive layer to etch or remove portions of the seed layer 7' that are not covered by the patterned metal layer 1542 so as to form a patterned fourth circuit layer 154. That is, the portions of the seed layer 7' may be removed by etching process such as a wet etching process. In some embodiments, the at least one etchant may include a first etchant and a second etchant. The first etchant may be used for etching the first metal layer 7a, and the second etchant may be used for etching the second metal layer 7b. Meanwhile, the etched seed layer 7' (including the etched first metal layer 7a and the etched second metal layer 7b) becomes a seed layer 1541 under the patterned metal layer 1542. Thus, the fourth circuit layer 154 includes the seed layer 1541 (including the etched first metal layer 7a and the etched second metal layer 7b) and the metal layer 1542 disposed on the seed layer 1541.

In some embodiments, the developer used in the stage of FIG. 12 and the etchant used in the stage of FIG. 15 may also etch or damage the exposed portion of the extending portion 76 and/or the exposed portion of the peripheral portion 74 of the seed layer 7 that is exposed from the fifth dielectric layer 145. That is, only a small amount of the extending portion 76 and/or the peripheral portion 74 of the seed layer 7 may be etched. In addition, there is a distance (or gap) $D_1$ (FIG. 8 and FIG. 9) between the circumference edge 84 of the under layer 8 and the circumference edge 94 of the carrier 9, thus, the under layer 8 may be prevented from being attacked by the developer used in the stage of FIG. 12 and the etchant used in the stage of FIG. 15. As a result, the under layer 8 may not be peeled off from the carrier 9 readily before the circuit structure 1' (e.g., a wiring structure 1') (FIG. 17) is manufactured completely. That is, the risk that the under layer 8 is attacked and peeled off from the carrier 9 is reduced. Therefore, a yield of the circuit structure 1' (e.g., a wiring structure 1') (FIG. 17) may be improved.

In order to provide enough protection by the peripheral portion 74 of the seed layer 7, the distance (or gap) $D_1$ (FIG.

Figure 17:
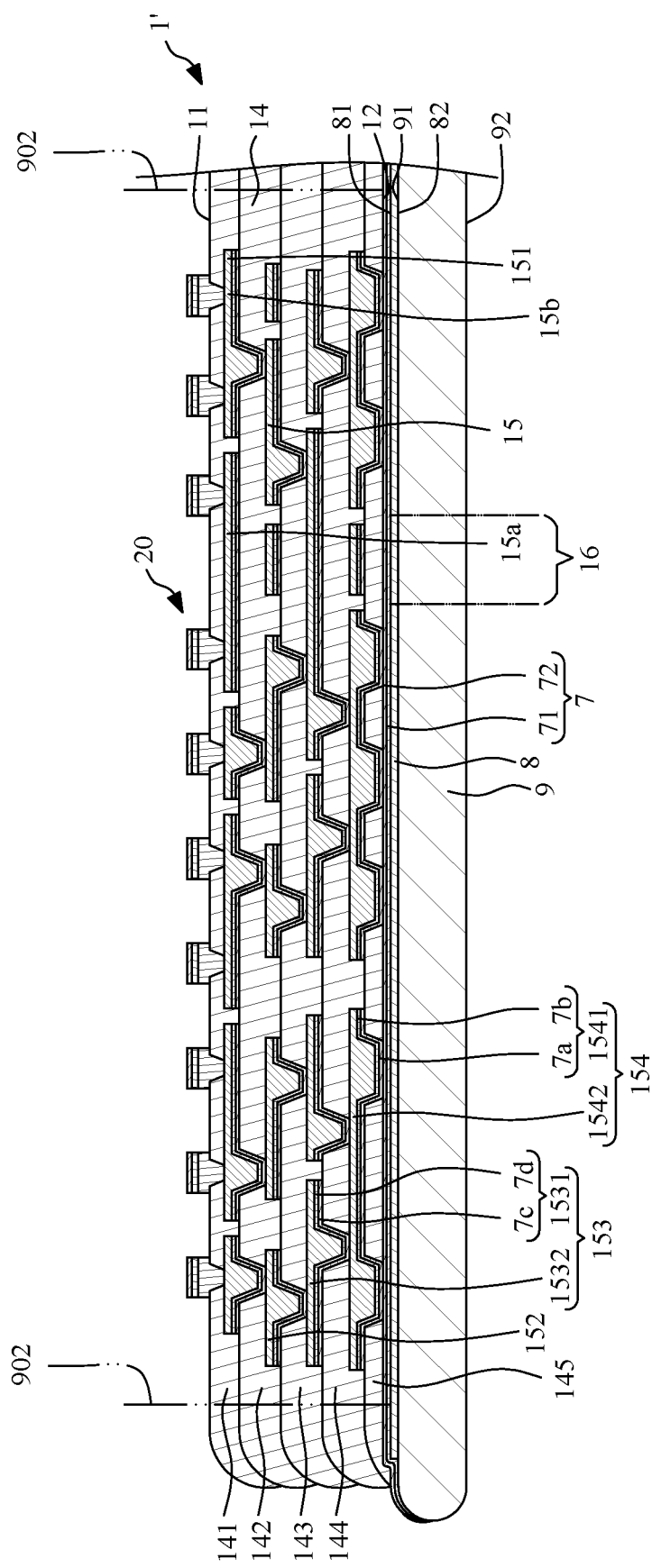
FIG. 17 illustrates one or more stages of an example of a method for manufacturing an assembly structure according to some embodiments of the present disclosure.

8 and FIG. 9) may be greater than 0.1 mm. If the distance (or gap) D₁ is less than 0.1 mm, the entire peripheral portion 74 of the seed layer 7 may be etched away readily, and the under layer 8 may be attacked by the developer and the etchant. Further, in order to facilitate removing the under layer 8 and the carrier 9 from the circuit structure 1' (e.g., a wiring structure 1') (FIG. 17), the distance (or gap) D₁ may be less than 0.5 mm. If the distance (or gap) D₁ is greater than 0.5 mm, the peripheral portion 74 of the seed layer 7 that is attached on the carrier 9 may be too wide or too large, thus, it is difficult to remove the under layer 8 and the carrier 9 from the circuit structure 1' (e.g., a wiring structure 1') (FIG. 17). Therefore, the distance (or gap) D₁ should be controlled in a suitable range.

Figure 16:
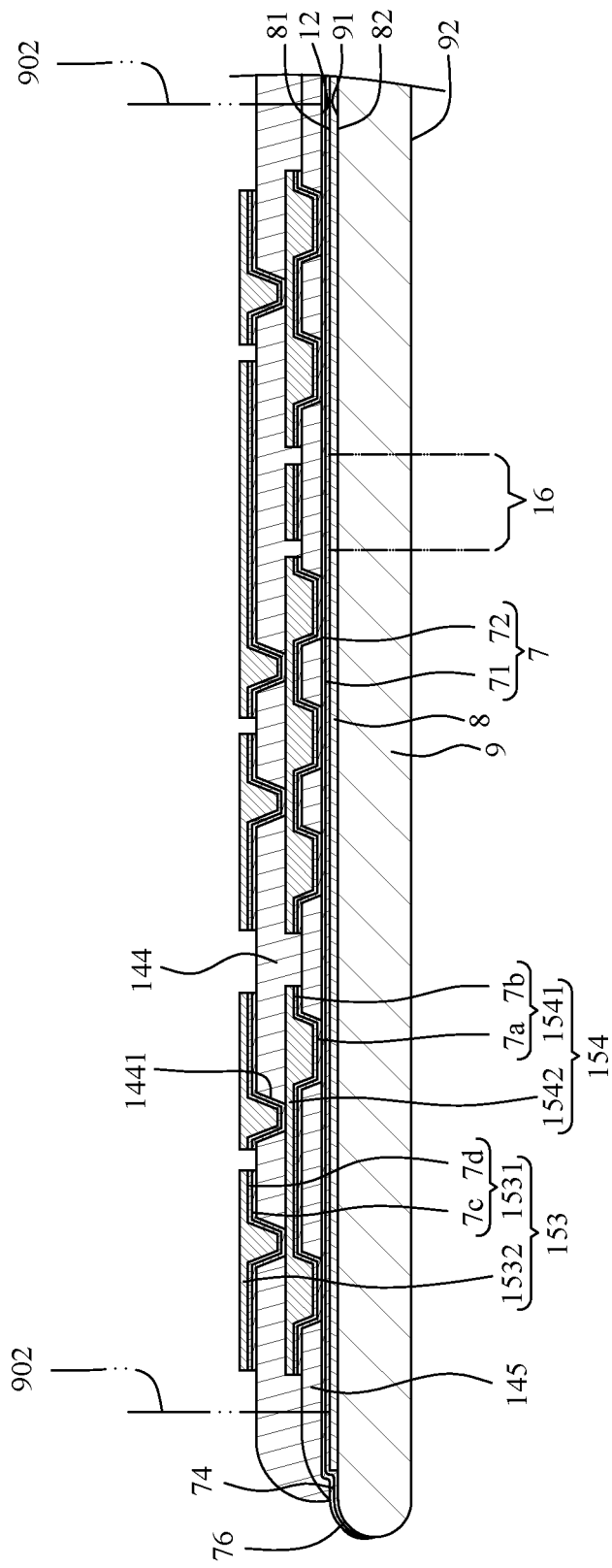
FIG. 16 illustrates one or more stages of an example of a method for manufacturing an assembly structure according to some embodiments of the present disclosure.

Referring to FIG. 16, a fourth dielectric layer 144 is formed on the fifth dielectric layer 145 to cover the fourth circuit layer 154 through, for example, spin coating. Then, a plurality of through holes 1441 may be formed in the fourth dielectric layer 144 by using a developer. The through holes 1441 may extend through the fourth dielectric layer 144 to expose portions of the fourth circuit layer 154. Then, a patterned third circuit layer 153 is formed on the fourth dielectric layer 144 and in the through holes 1441 to contact the exposed portions of the fourth circuit layer 154. In some embodiments, the fourth dielectric layer 144 and the third circuit layer 153 may be formed by the similar way as shown in the stages of FIGS. 11 to 15.

As shown in FIG. 16, the third circuit layer 153 may include a seed layer 1531 and a metal layer 1532 disposed on the seed layer 1531. The metal layer 1532 may include a Cu layer that is formed through electroplating. The seed layer 1531 may include a first metal layer 7c (e.g., a Ti layer) and a second metal layer 7d (e.g., a Cu layer) that are etched by using or applying at least one etchant. In some embodiments, the developer and the etchant used in this stage may also further etch or damage the exposed portion of the extending portion 76 and/or the exposed portion of the peripheral portion 74 of the seed layer 7 that is exposed from the fifth dielectric layer 145. Similarly, the under layer 8 may be prevented from being attacked by the developer and the etchant used in this stage.

Referring to FIG. 17, the stages of FIGS. 11 to 16 are repeated to form a second circuit layer 152, a second dielectric layer 142, a first circuit layer 151 and a first dielectric layer 141. Then, a plurality of protrusion pads 20 are formed on the first dielectric layer 141. The protrusion pads 20 may extend through the first dielectric layer 141 to electrically connect the first circuit layer 151. Thus, a circuit structure 1' (e.g., the wiring structure 1') is formed or disposed on the seed layer 7 on the under layer 8 on the carrier 9. The circuit structure 1' (e.g., the wiring structure 1') of FIG. 17 may be similar to the wiring structure 1 of FIG. 2 and FIG. 3. During the formation of the circuit structure 1' (e.g., the wiring structure 1'), the extending portion 76 and/or the peripheral portion 74 of the seed layer 7 can protect the under layer 8 from being attacked by the developer and the etchant. Thus, a size (e.g., a width or a diameter) of the under layer 8 in FIG. 17 is the same as a size (e.g., a width or a diameter) of the under layer 8 in FIG. 8 and FIG. 9.

Figure 18:
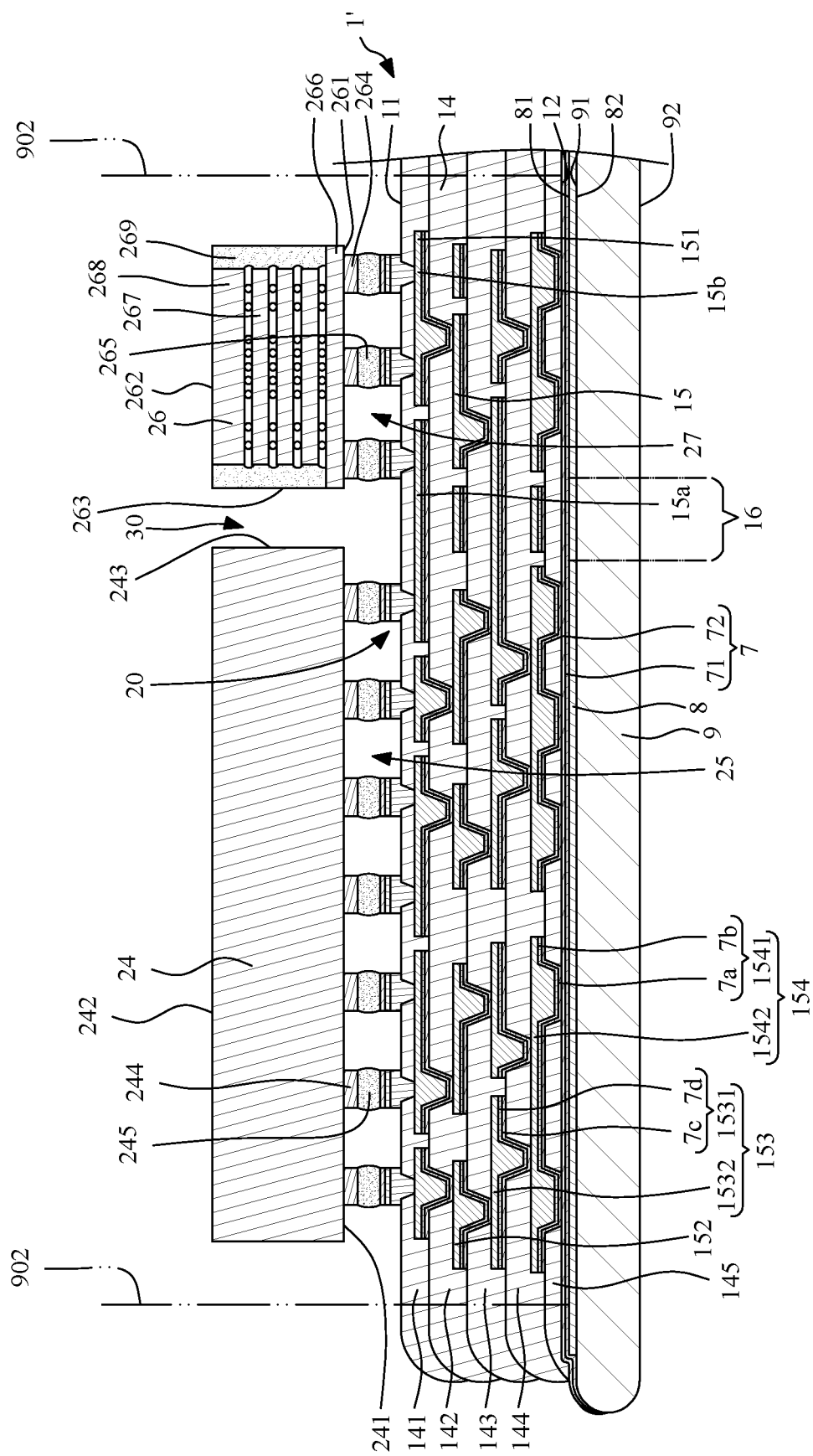
FIG. 18 illustrates one or more stages of an example of a method for manufacturing an assembly structure according to some embodiments of the present disclosure.

Referring to FIG. 18, a first electronic device 24 and a second electronic device 26 are provided. The first electronic device 24 and the second electronic device 26 of FIG. 18 may be similar to the first electronic device 24 and the second electronic device 26 of FIG. 2, respectively. Then, the first electronic device 24 and the second electronic device 26 are electrically connected to the circuit layer 15 of the circuit structure 1' (e.g., the wiring structure 1') by flip-chip bonding. Thus, the first electronic device 24 and the second electronic device 26 are disposed and bonded on the circuit structure 1' (e.g., the wiring structure 1') side by side, and the second electronic device 26 may be electrically connected to the first electronic device 24 through the interconnection portion 15a of the circuit layer 15. Meanwhile, a central gap 30 is formed between the first electronic device 24 and the second electronic device 26.

Figure 19:
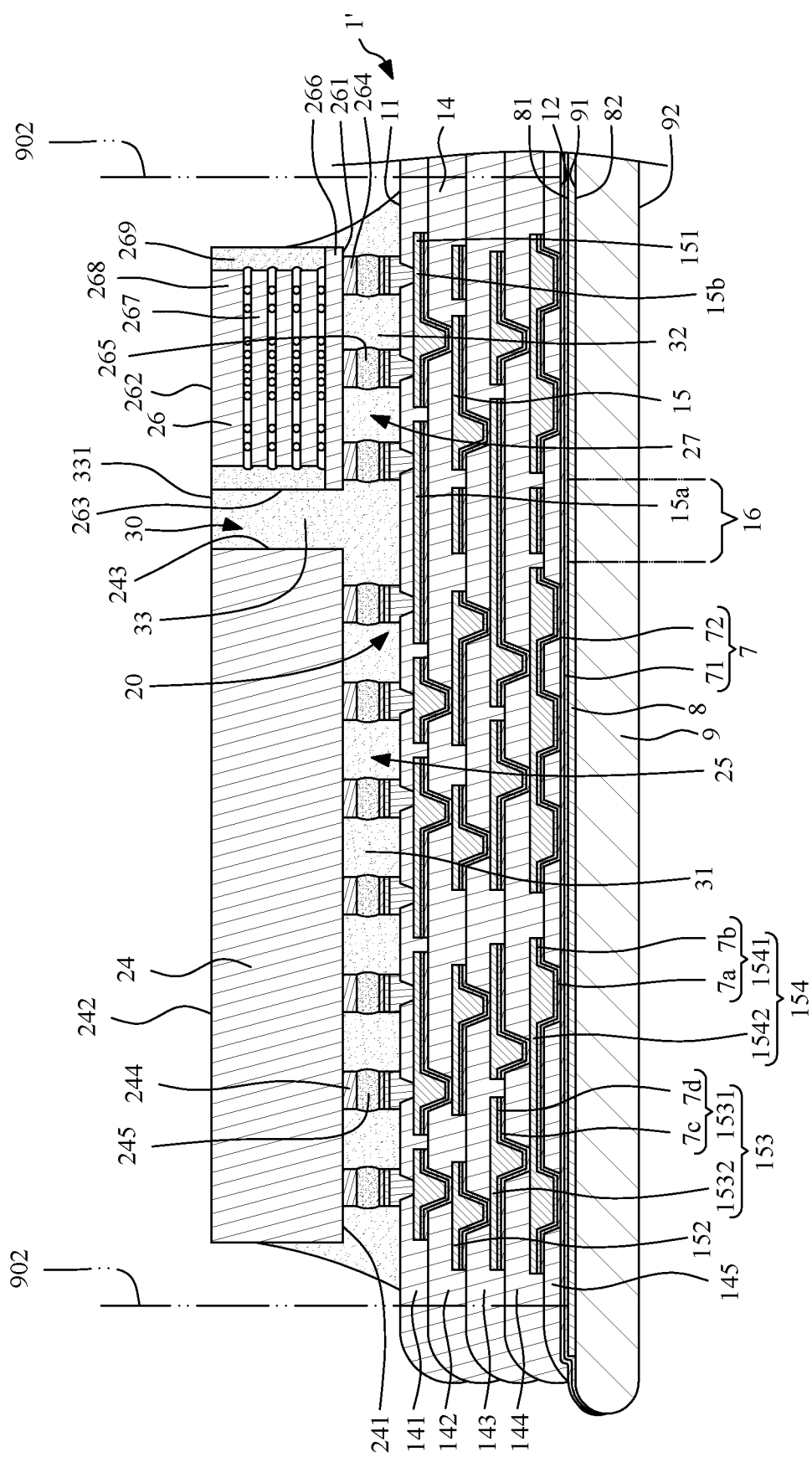
FIG. 19 illustrates one or more stages of an example of a method for manufacturing an assembly structure according to some embodiments of the present disclosure.

Referring to FIG. 19, a protection material 33 (including a first protection material 31 and a second protection material 32) may be applied. For example, the first protection material 31 may be disposed in a first space 25 between the first electronic device 24 and the circuit structure 1' (e.g., the wiring structure 1'). Further, the second protection material 32 may be disposed in a second space 27 between the second electronic device 26 and the circuit structure 1' (e.g., the wiring structure 1'). In addition, a portion of the protection material 33 may be disposed in the central gap 30.

Figure 20:
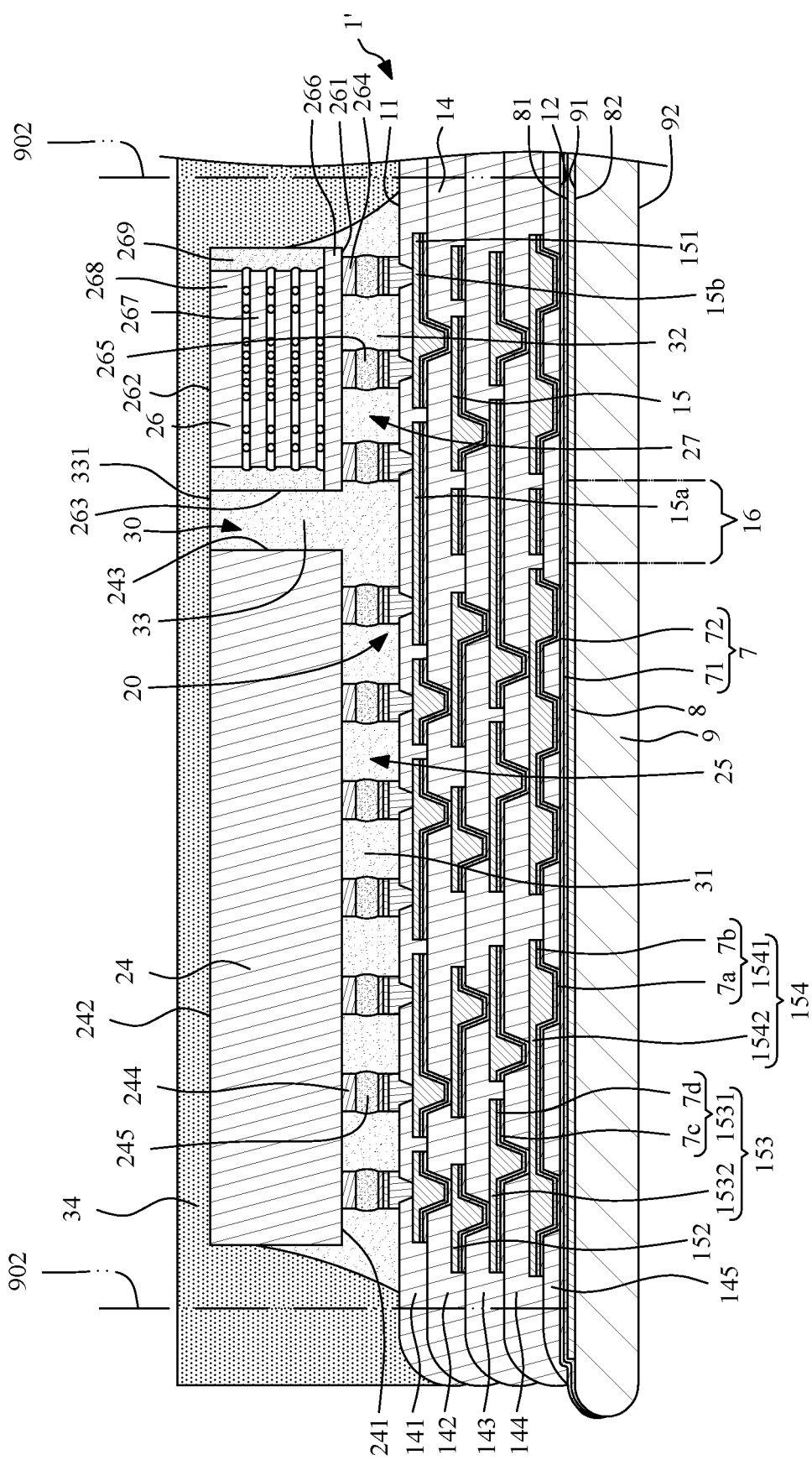
FIG. 20 illustrates one or more stages of an example of a method for manufacturing an assembly structure according to some embodiments of the present disclosure.

Referring to FIG. 20, an encapsulant 34 (e.g., a molding compound) is formed or disposed to cover at least a portion of the first electronic device 24, at least a portion of the second electronic device 26, the protection material 33 and a portion of the circuit structure 1' (e.g., the wiring structure 1').

Figure 21:
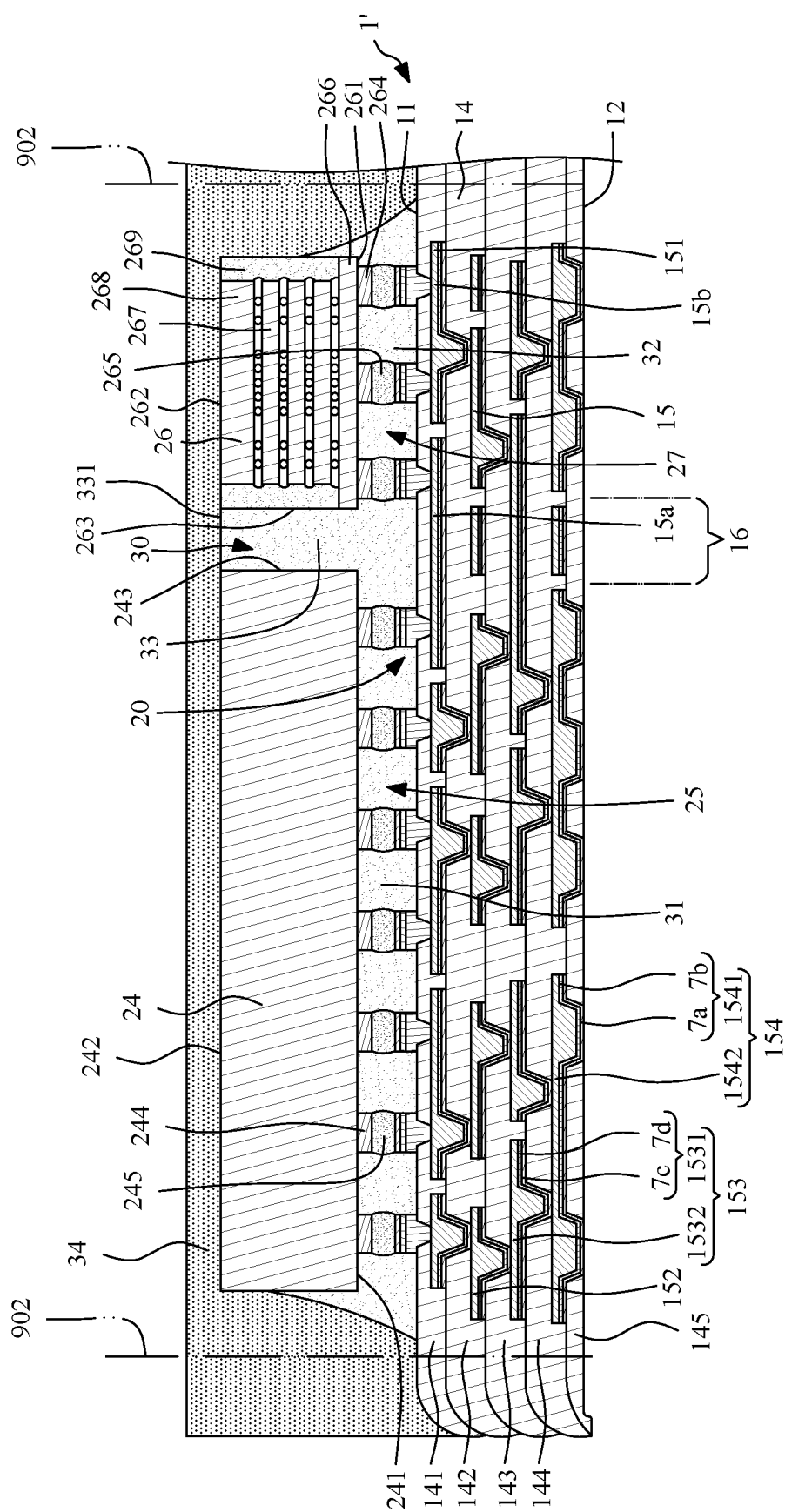
FIG. 21 illustrates one or more stages of an example of a method for manufacturing an assembly structure according to some embodiments of the present disclosure.

Referring to FIG. 21, the carrier 9, the under layer 8 and the seed layer 7 are removed. Thus, portions (i.e., the bottom portions of the via portions) of the fourth circuit layer 154 are exposed from the second surface 12 of the circuit structure 1' (e.g., the wiring structure 1').

Figure 22:
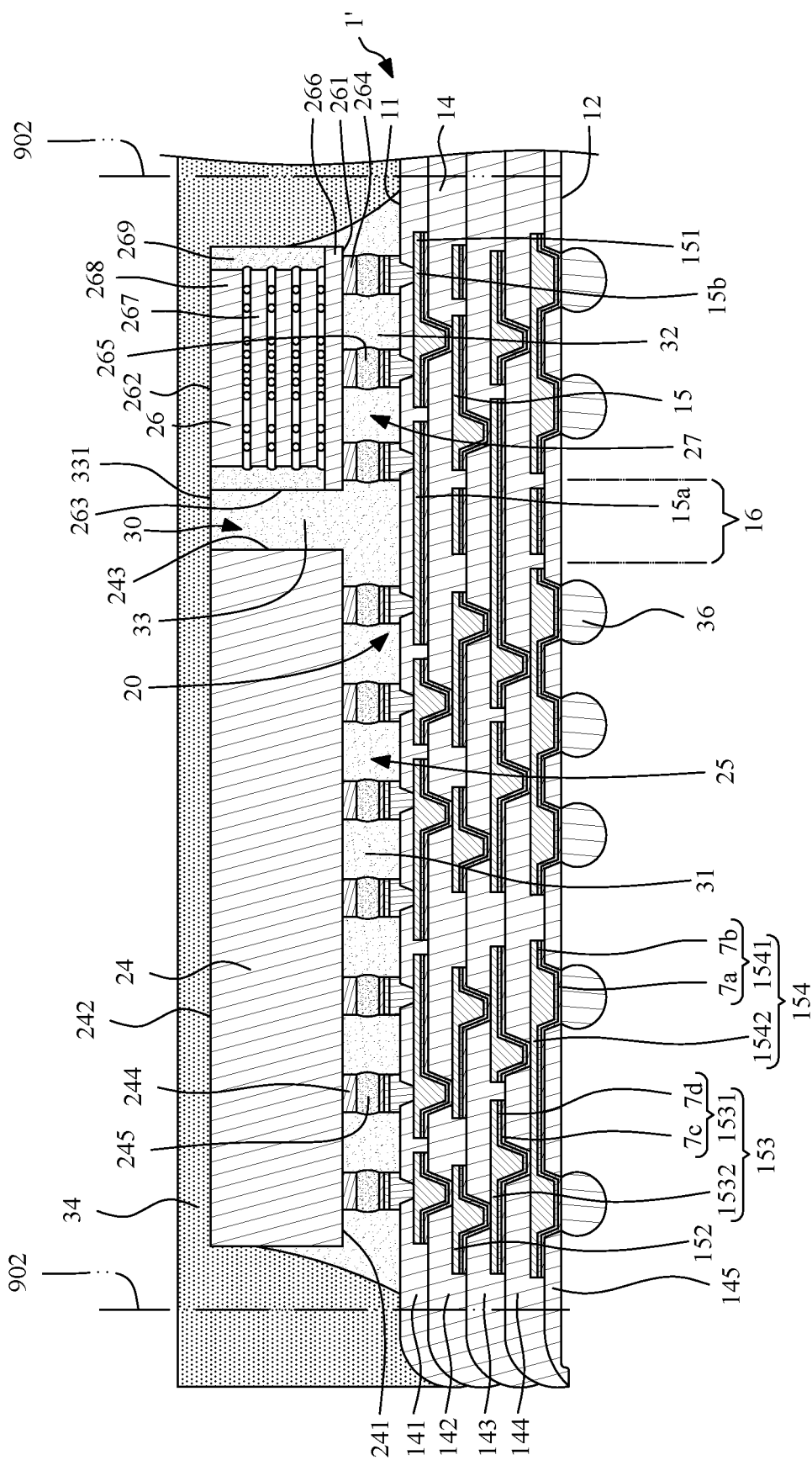
FIG. 22 illustrates one or more stages of an example of a method for manufacturing an assembly structure according to some embodiments of the present disclosure.

Referring to FIG. 22, a plurality of solder materials 36 (e.g., solder balls) are formed or disposed to the second surface 12 of the circuit structure 1' (e.g., the wiring structure 1'). As shown in FIG. 22, the solder materials 36 are disposed on the exposed portions (i.e., the bottom portions of the via portions) of the fourth circuit layer 154.

Then, the encapsulant 34 may be thinned from its top surface. Thus, the top surface 341 of the encapsulant 34, the first backside surface 242 of the first electronic device 24, the second backside surface 262 of the second electronic device 26 and a top surface 331 of the protection material 33 in the gap 30 may be substantially coplanar with each other.

In some embodiments, a singulation process may be conducted to cut the encapsulant 34 and the circuit structure 1' (e.g., the wiring structure 1') along the cutting lines 902 so as to obtain a plurality of package structures 3 shown in FIG. 1 to FIG. 3.

Figure 23:
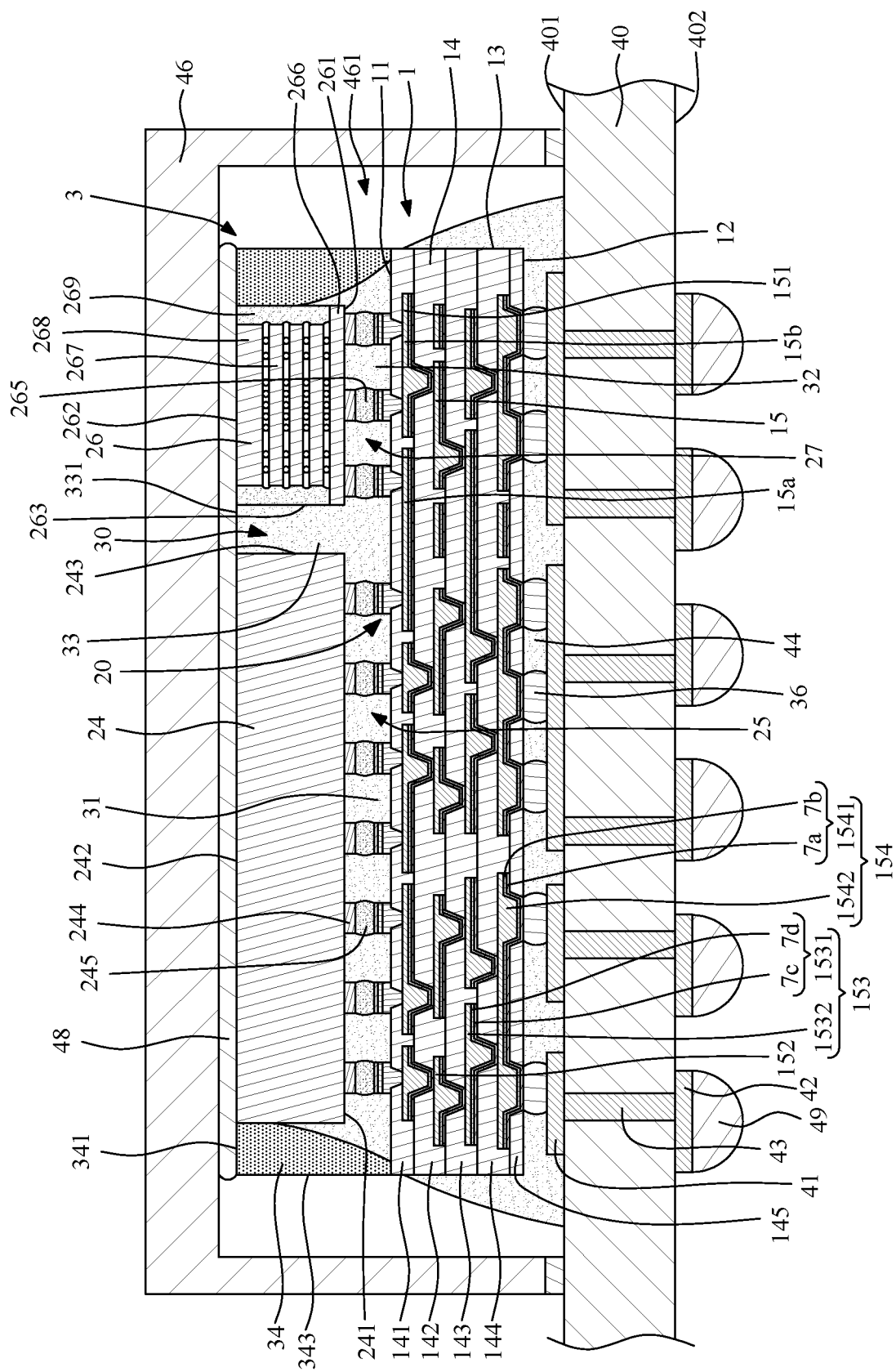
FIG. 23 illustrates one or more stages of an example of a method for manufacturing an assembly structure according to some embodiments of the present disclosure.

Referring to FIG. 23, the package structure 3 may be electrically connected to a first circuit layer 41 of a base substrate 40 through the solder materials 36. The base substrate 40 of FIG. 23 may be similar to or same as the base substrate 40 of FIG. 4. Then, a protection material 44 (i.e., an underfill) may be formed or disposed in a space between the package structure 3 and the base substrate 40. Then, a heat sink 46 may be attached to the first electronic device 24, the second electronic device 26 and the base substrate 40. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material. Then, a plurality of external connectors 49 (e.g., solder balls) may be formed or disposed on the second circuit layer 42 for external connection. Then, a singulation process may be conducted to cut the base substrate 40 so as to obtain a plurality of assembly structures 4 shown in FIG. 4.

Figure 24:
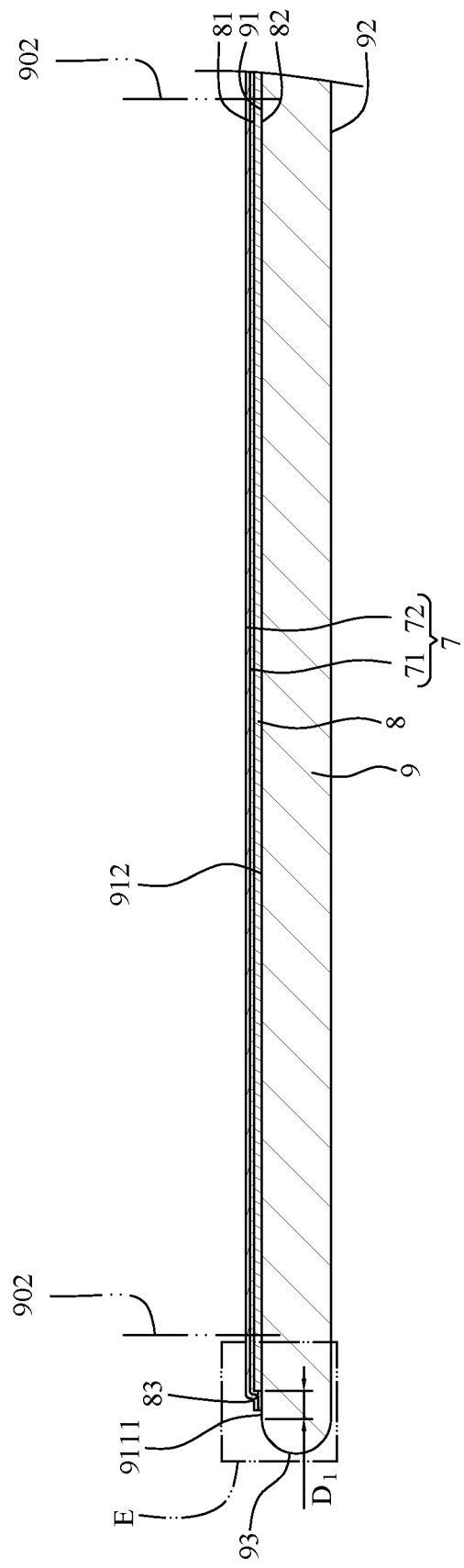
FIG. 24 illustrates one or more stages of an example of a method for manufacturing an assembly structure according to some embodiments of the present disclosure.

FIG. 24 through FIG. 28 illustrates a method for manufacturing an assembly structure according to some embodiments of the present disclosure, such as the assembly structure 4 shown in FIG. 4. The initial stages of the illustrated process are the same as, or similar to, the stages illustrated in FIG. 5 to FIG. 10. FIG. 24 depicts a stage subsequent to that depicted in FIG. 10.

Figure 25:
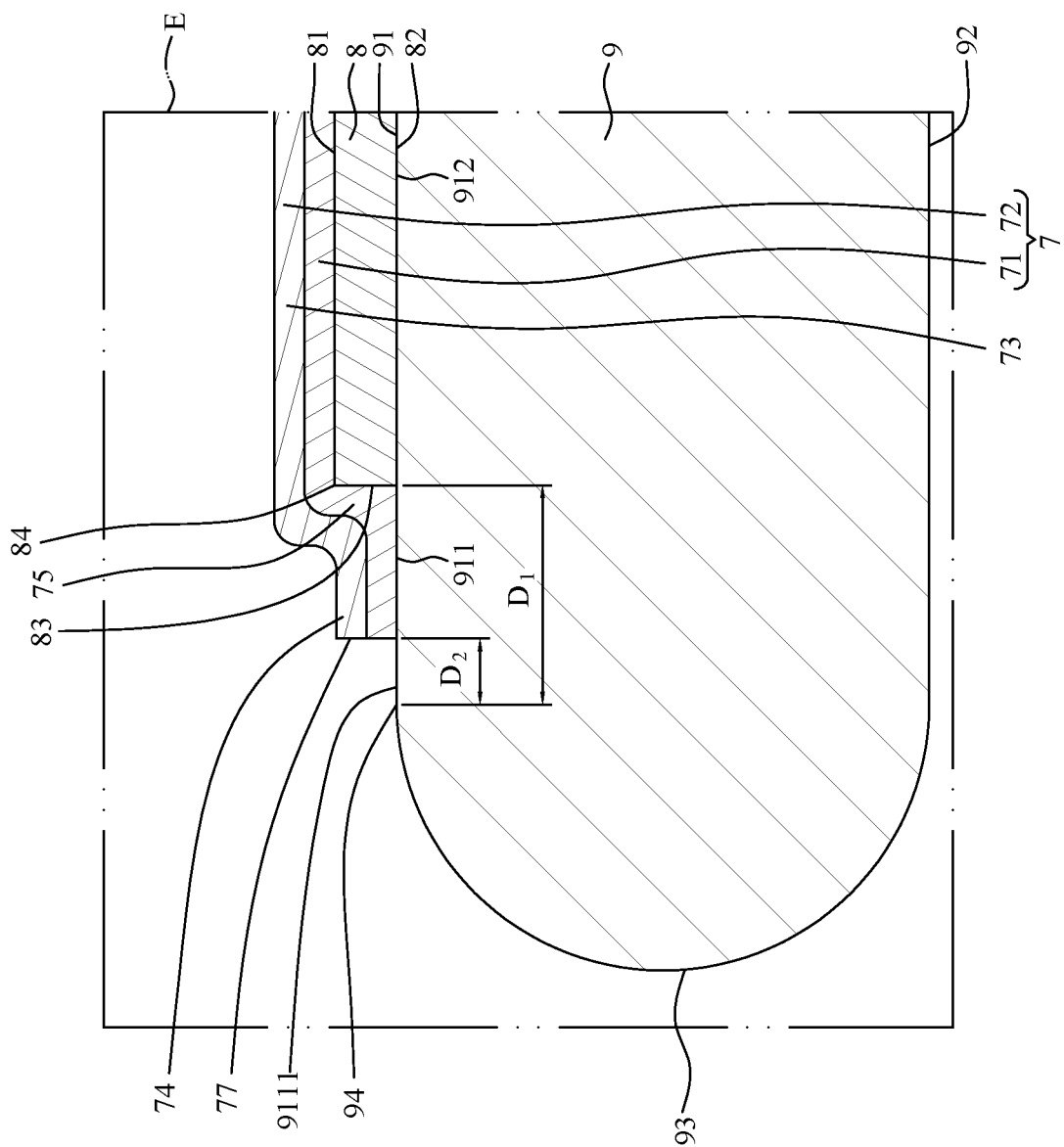
FIG. 25 illustrates one or more stages of an example of a method for manufacturing an assembly structure according to some embodiments of the present disclosure.

Referring to FIG. 24 and FIG. 25, wherein FIG. 25 illustrates an enlarged cross-sectional view of a region "E" of FIG. 24, a portion of the peripheral portion 74 of the seed layer 7 are removed so as to expose a portion 9111 of the flat portion 911 of the top surface 91 of the carrier 9. In some embodiments, a photoresist layer may be formed or disposed on the entire seed layer 7, then the peripheral portion of the photoresist layer is removed by edge bead removal (EBR) process to expose a portion of the peripheral portion 74 of the seed layer 7. Then, the exposed portion of the peripheral portion 74 of the seed layer 7 is removed by, for example, etching such as wet etching. In some embodiments, the extending portion 76 of the seed layer 7 may be removed concurrently. Meanwhile, a size (e.g., a width or a diameter) of the seed layer 7 is less than a size (e.g., a width or a diameter) of the carrier 9, and is greater than a size (e.g., a width or a diameter) of the under layer 8. As shown in FIG. 25, there may be a distance (or a gap) $D_2$ between the lateral side surface 77 of the seed layer 7 and the circumference edge 94 of the carrier 9. It is noted that the distance (or a gap) $D_2$ may correspond to or equal to a width of the removed portion of the peripheral portion 74 of the seed layer 7. The distance (or a gap) $D_2$ may be less than the distance (or a gap) $D_1$.

Figure 26:
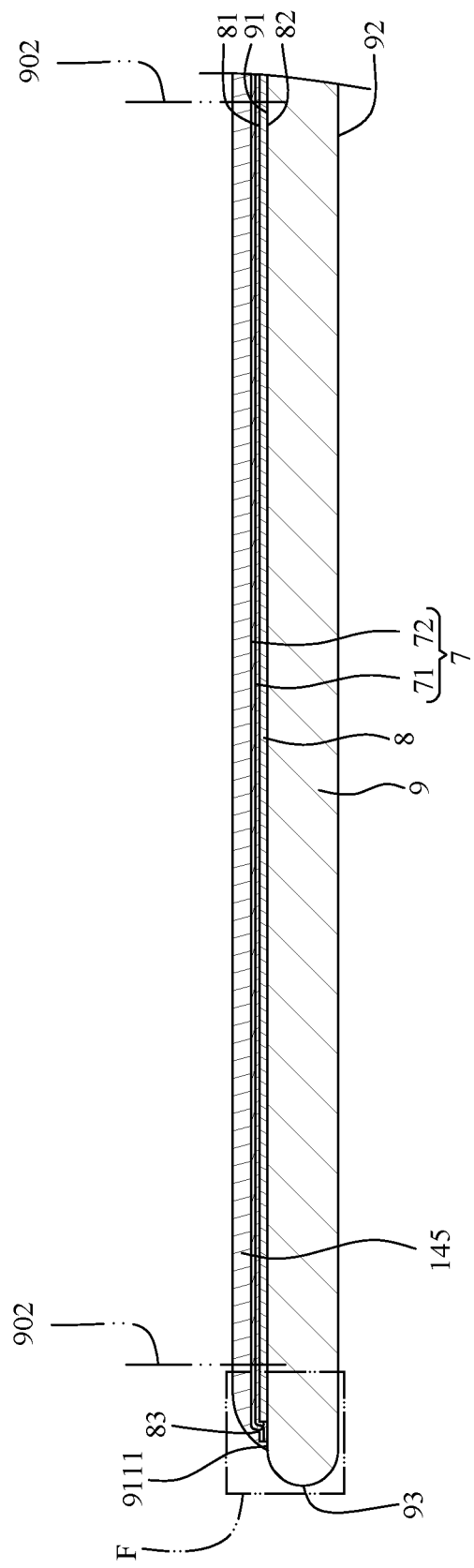
FIG. 26 illustrates one or more stages of an example of a method for manufacturing an assembly structure according to some embodiments of the present disclosure.
Figure 27:
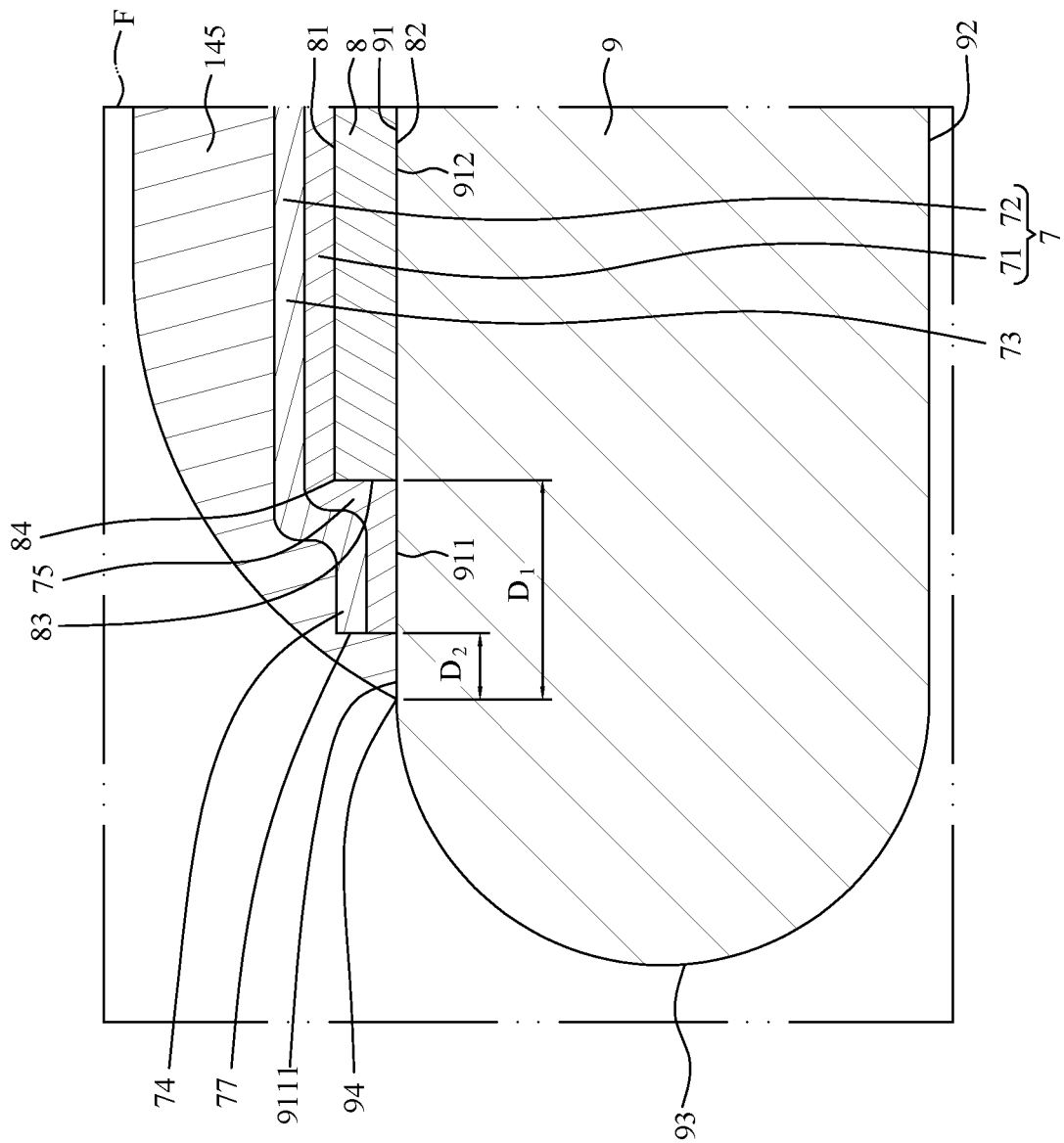
FIG. 27 illustrates one or more stages of an example of a method for manufacturing an assembly structure according to some embodiments of the present disclosure.

Referring to FIG. 26 and FIG. 27, wherein FIG. 27 illustrates an enlarged cross-sectional view of a region "F" of FIG. 26, a material (e.g., a fifth dielectric layer 145 (i.e., a bottommost dielectric layer)) in a flowable state is formed on the seed layer 7 through, for example, spin-coating. The material (e.g., the fifth dielectric layer 145) may cover and contact the exposed portion 9111 of the flat portion 911 of the top surface 91 of the carrier 9.

Figure 27A:
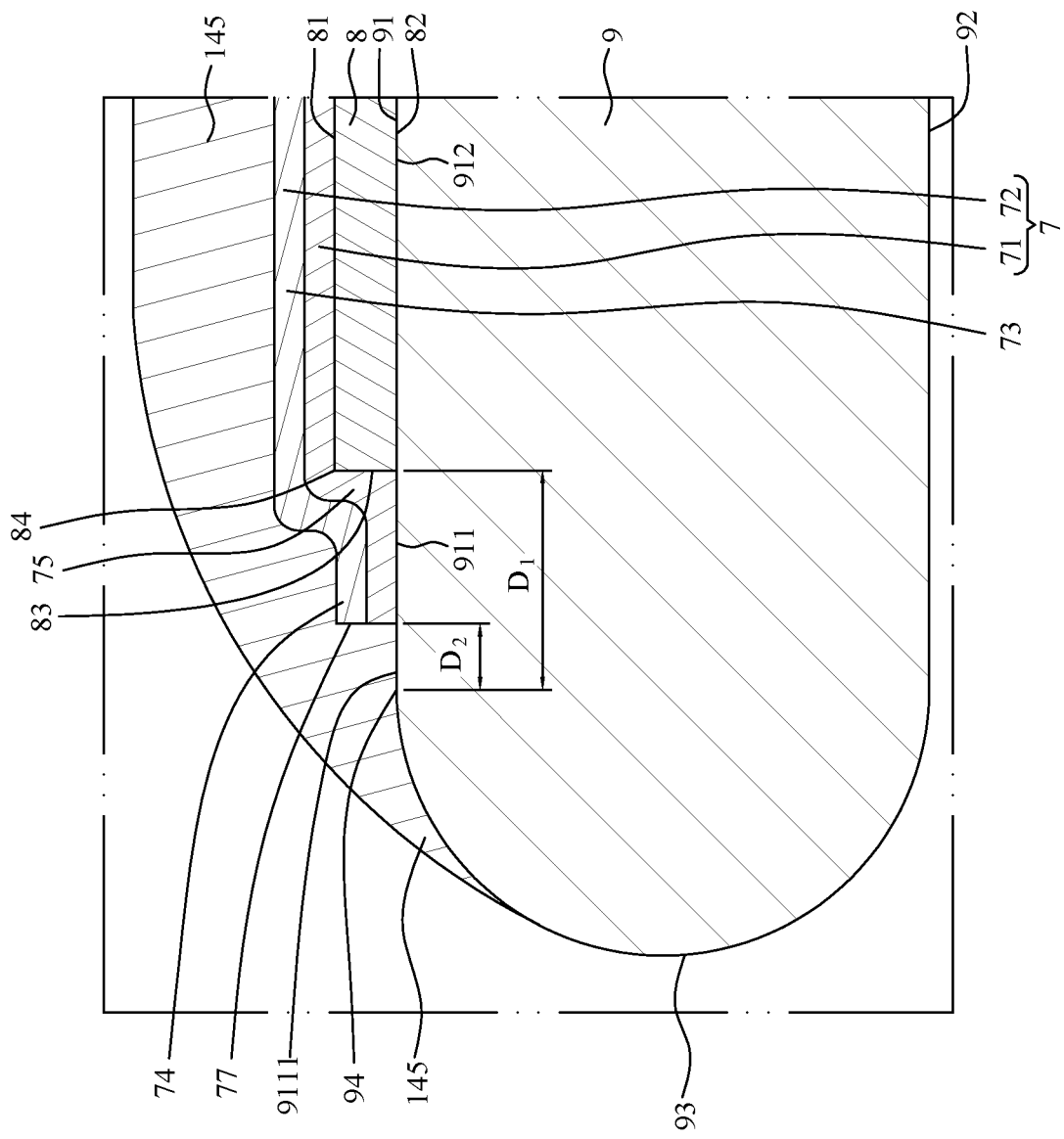
FIG. 27A illustrates another example of FIG. 27.

FIG. 27A illustrates another example of FIG. 27. As shown in FIG. 27A, the material (e.g., the fifth dielectric layer 145) may further cover and contact the lateral side surface 93 of the carrier 9.

Figure 28:
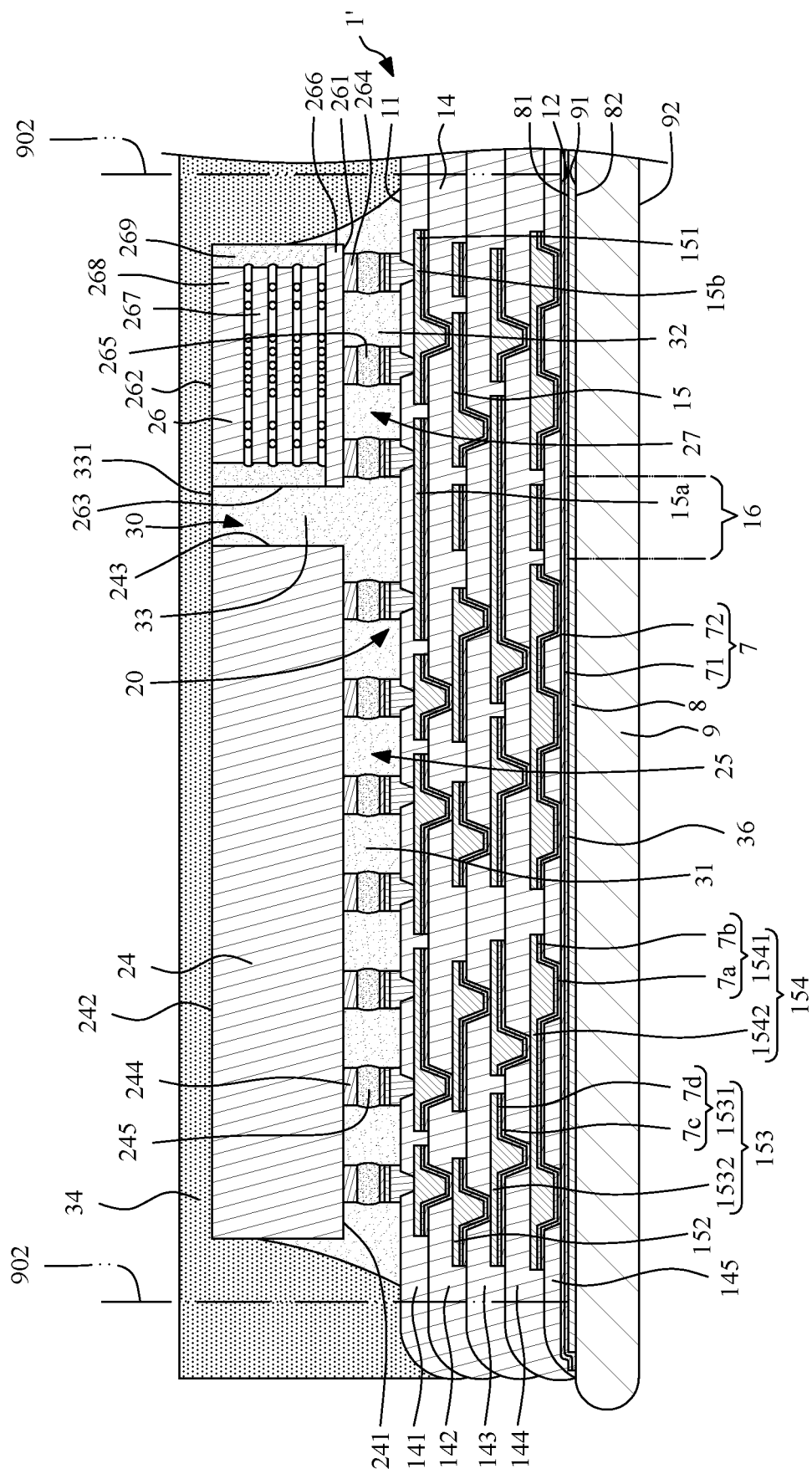
FIG. 28 illustrates one or more stages of an example of a method for manufacturing an assembly structure according to some embodiments of the present disclosure.

Then, the following stages of the method may be similar to the stages illustrated in FIG. 12 to FIG. 20 so as to form or dispose the circuit structure 1' (e.g., the wiring structure 1'), the first electronic device 24, the second electronic device 26, the protection material 33 and the encapsulant 34 on the seed layer 7, as shown in FIG. 28.

Then, the following stages of the method may be similar to the stages illustrated in FIG. 21 to FIG. 23 so as to obtain the assembly structure 4 as shown in FIG. 4.

Figure 29:
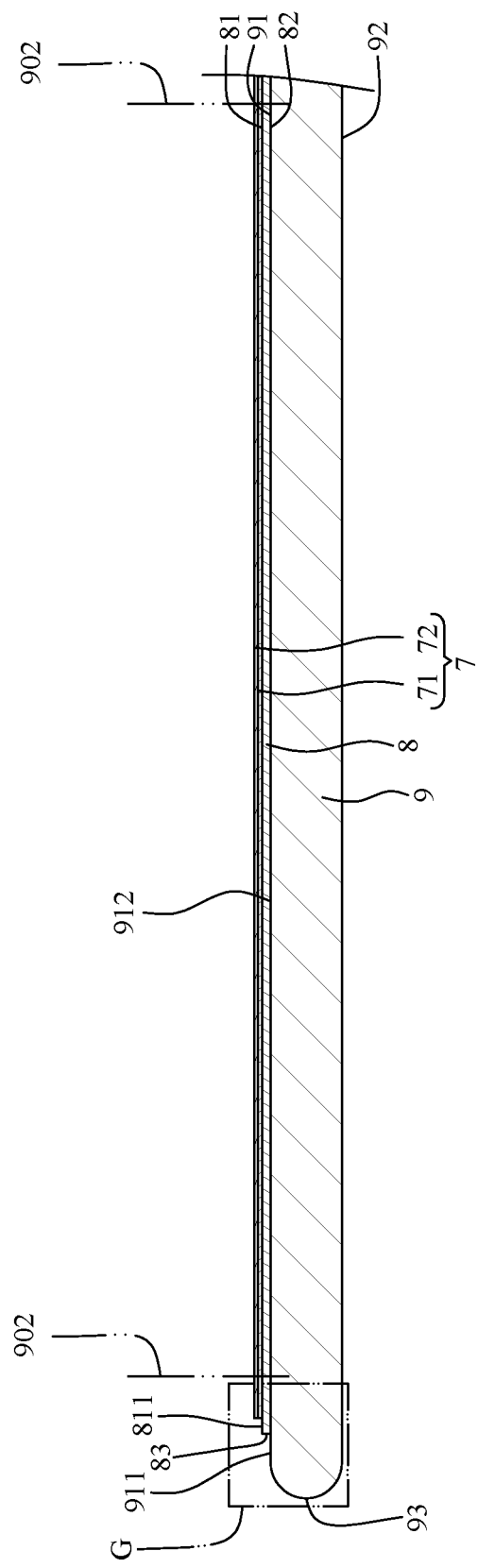
FIG. 29 illustrates one or more stages of an example of a method for manufacturing an assembly structure according to some embodiments of the present disclosure.

FIG. 29 through FIG. 33 illustrates a method for manufacturing an assembly structure according to some embodiments of the present disclosure, such as the assembly structure 4 shown in FIG. 4. The initial stages of the illustrated process are the same as, or similar to, the stages illustrated in FIG. 5 to FIG. 10. FIG. 29 depicts a stage subsequent to that depicted in FIG. 10.

Figure 30:
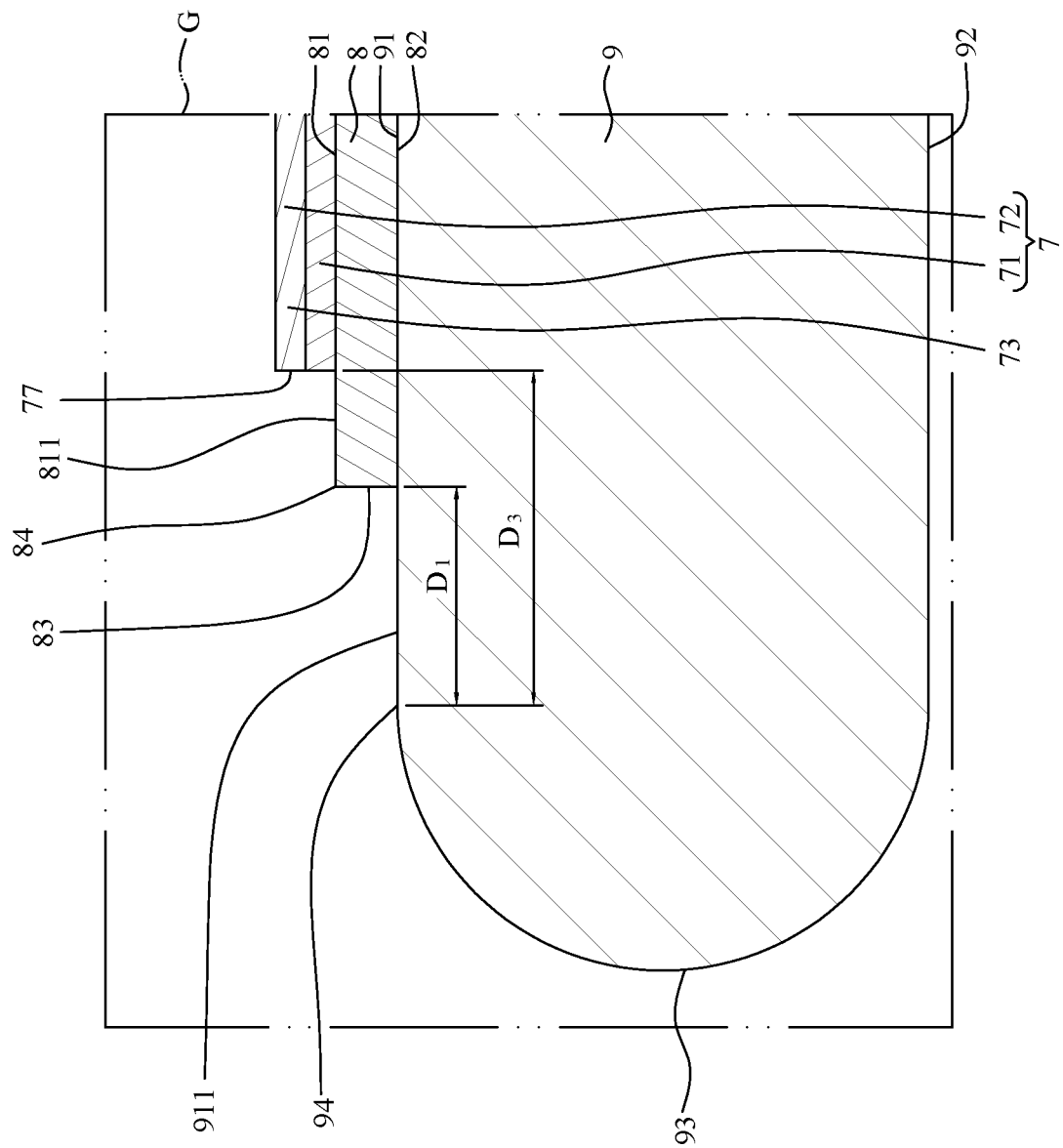
FIG. 30 illustrates one or more stages of an example of a method for manufacturing an assembly structure according to some embodiments of the present disclosure.

Referring to FIG. 29 and FIG. 30, wherein FIG. 30 illustrates an enlarged cross-sectional view of a region "G" of FIG. 29, the extending portion 76, the peripheral portion 74, the connecting portion 75, and a portion of the a main portion 73 of the seed layer 7 are removed by a process similar to the stage illustrated in FIG. 24, so as to expose a second peripheral portion 811 of the top surface 81 of the under layer 8 and the flat portion 911 of the top surface 91 of the carrier 9. Meanwhile, a size (e.g., a width or a diameter) of the seed layer 7 is less than a size (e.g., a width or a diameter) of the carrier 9, and is also less than a size (e.g., a width or a diameter) of the under layer 8. As shown in FIG. 30, there may be a distance (or a gap) $D_3$ between the lateral side surface 77 of the seed layer 7 and the circumference edge 94 of the carrier 9. It is noted that the distance (or a gap) $D_3$ may correspond to or equal to a width of the removed portion of the seed layer 7. The distance (or a gap) $D_3$ may be greater than the distance (or a gap) $D_1$.

Figure 31:
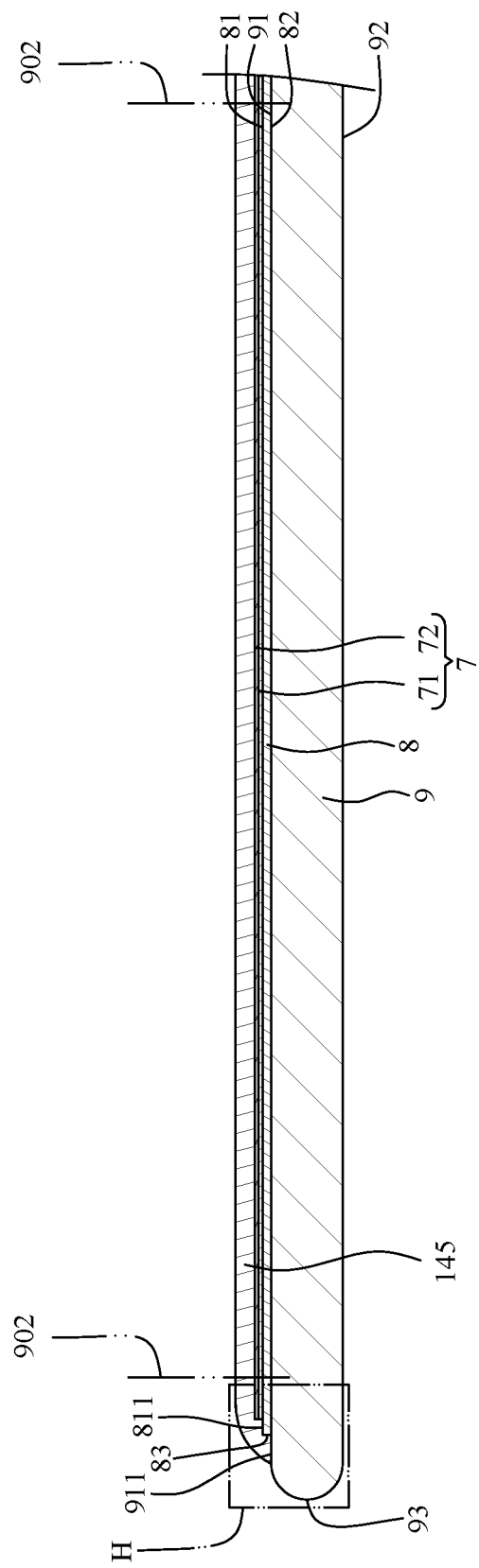
FIG. 31 illustrates one or more stages of an example of a method for manufacturing an assembly structure according to some embodiments of the present disclosure.
Figure 32:
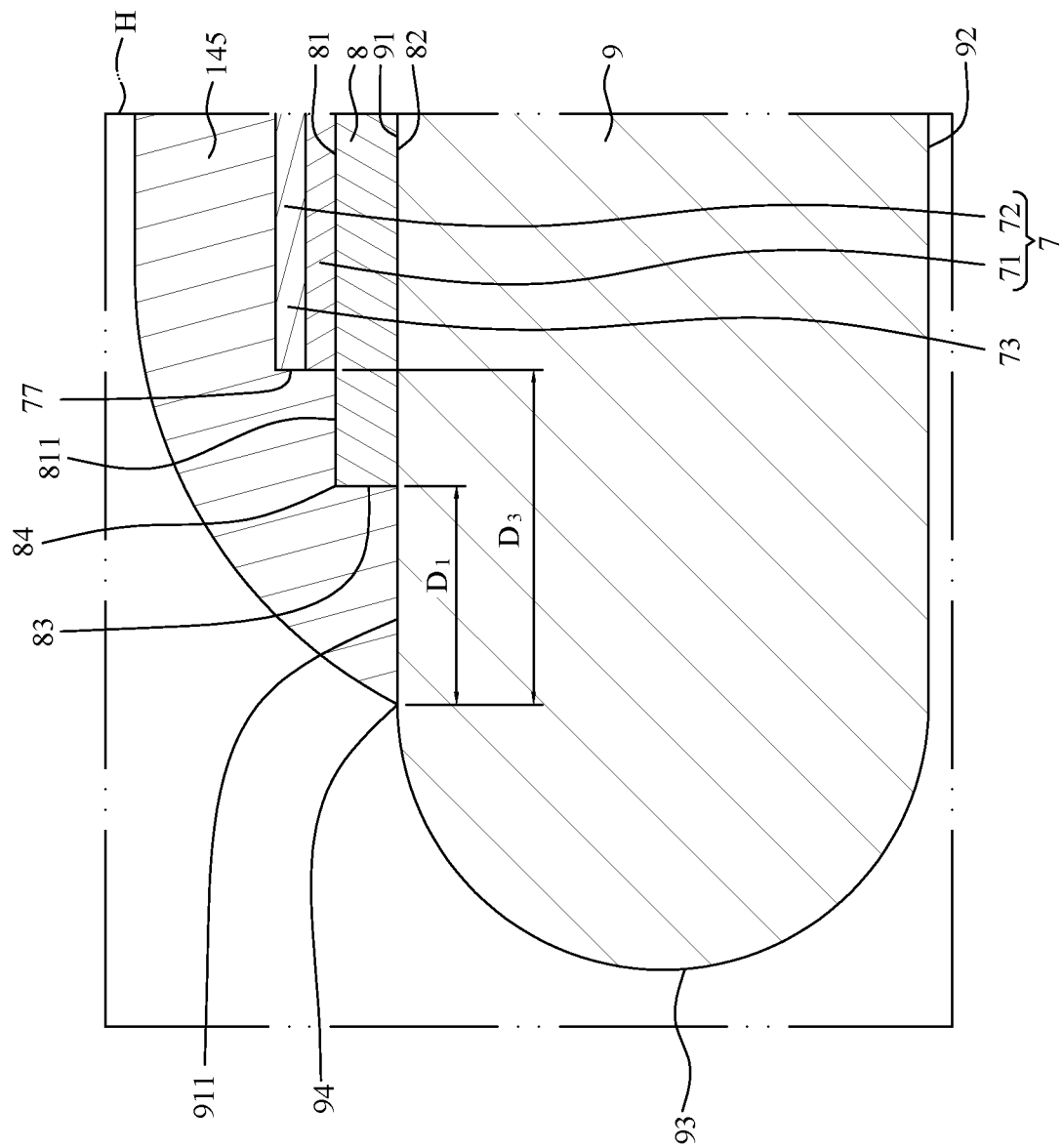
FIG. 32 illustrates one or more stages of an example of a method for manufacturing an assembly structure according to some embodiments of the present disclosure.

Referring to FIG. 31 and FIG. 32, wherein FIG. 32 illustrates an enlarged cross-sectional view of a region "H" of FIG. 31, a material (e.g., a fifth dielectric layer 145 (i.e., a bottommost dielectric layer)) in a flowable state is formed on the seed layer 7 through, for example, spin coating. The material (e.g., the fifth dielectric layer 145) may cover and contact the exposed second peripheral portion 811 of the top surface 81 of the under layer 8, the lateral side surface 83 of the under layer 8 and the exposed flat portion 911 of the top surface 91 of the carrier 9.

Figure 32A:
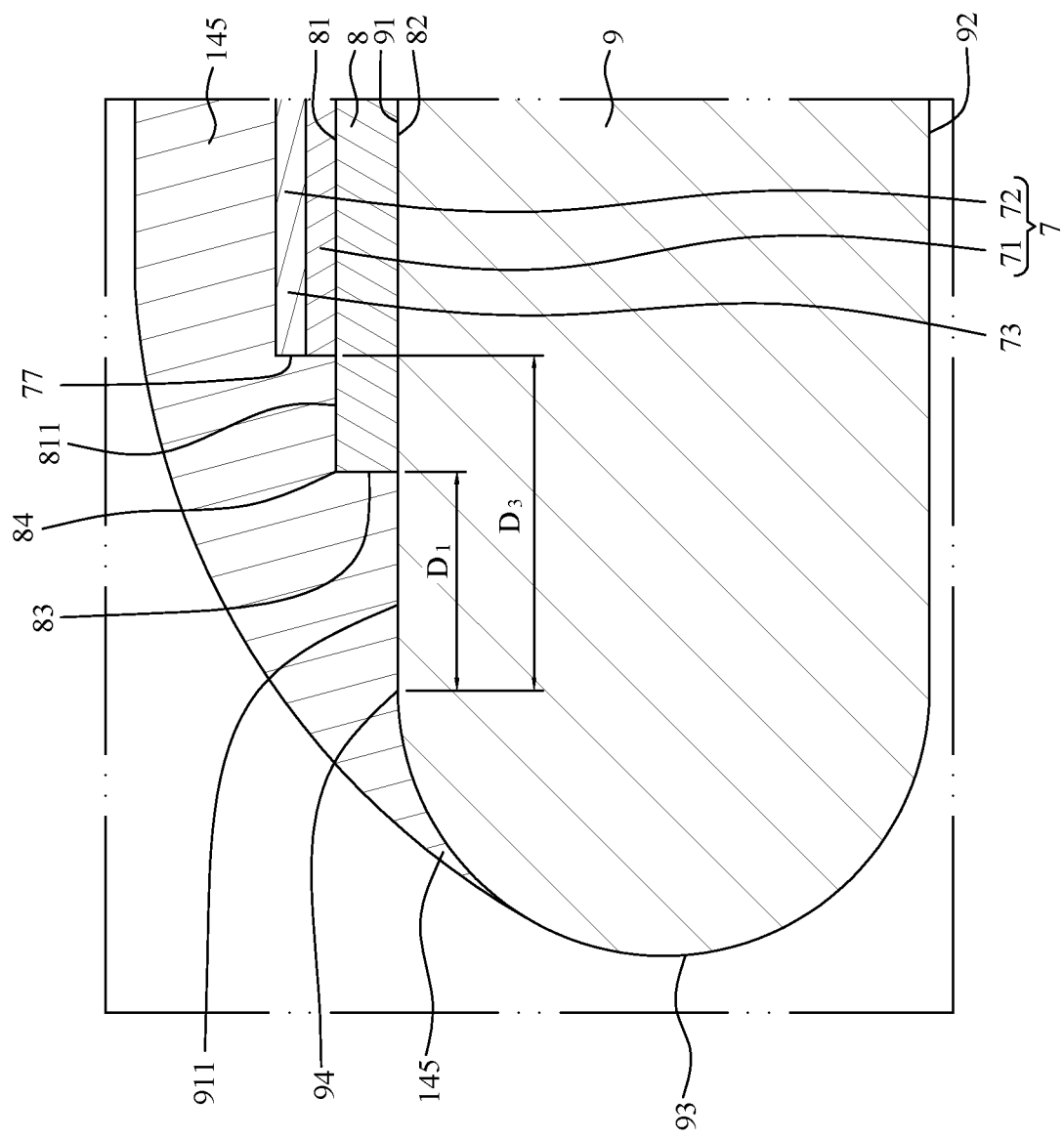
FIG. 32A illustrates another example of FIG. 32.

FIG. 32A illustrates another example of FIG. 32. As shown in FIG. 32A, the material (e.g., the fifth dielectric layer 145) may further cover and contact the lateral side surface 93 of the carrier 9.

Figure 33:
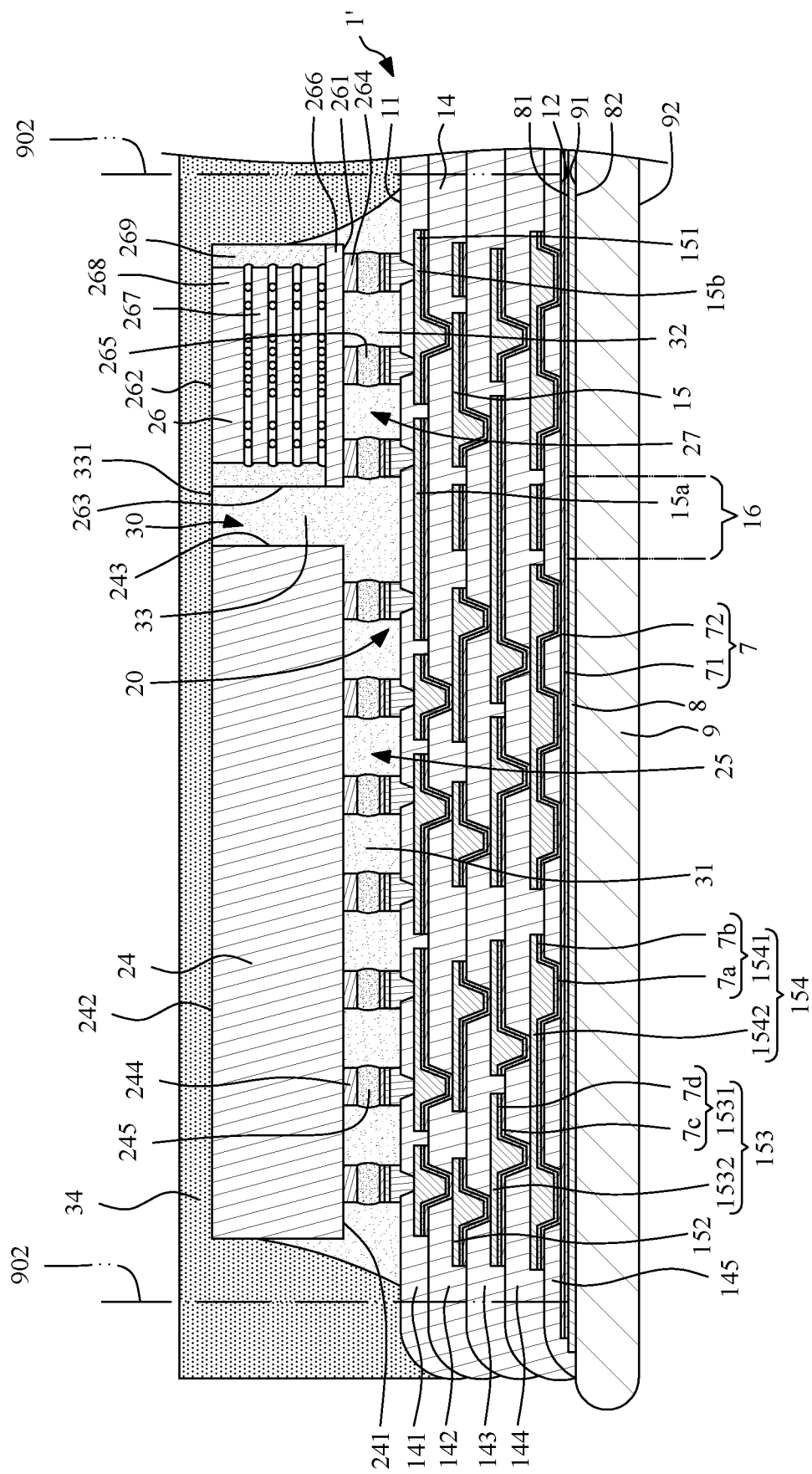
FIG. 33 illustrates one or more stages of an example of a method for manufacturing an assembly structure according to some embodiments of the present disclosure.

Then, the following stages of the method may be similar to the stages illustrated in FIG. 12 to FIG. 20 so as to form or dispose the circuit structure 1' (e.g., the wiring structure 1'), the first electronic device 24, the second electronic device 26, the protection material 33 and the encapsulant 34 on the seed layer 7, as shown in FIG. 33.

Then, the following stages of the method may be similar to the stages illustrated in FIG. 21 to FIG. 23 so as to obtain the assembly structure 4 as shown in FIG. 4.

FIG. 34 through FIG. 40 illustrates a method for manufacturing an assembly structure according to some embodiments of the present disclosure, such as the assembly structure 4 shown in FIG. 4. The illustrated process are the same as, or similar to, the process illustrated in FIG. 5 to FIG. 23 except that a structure of the carrier 9c.

Figure 34:
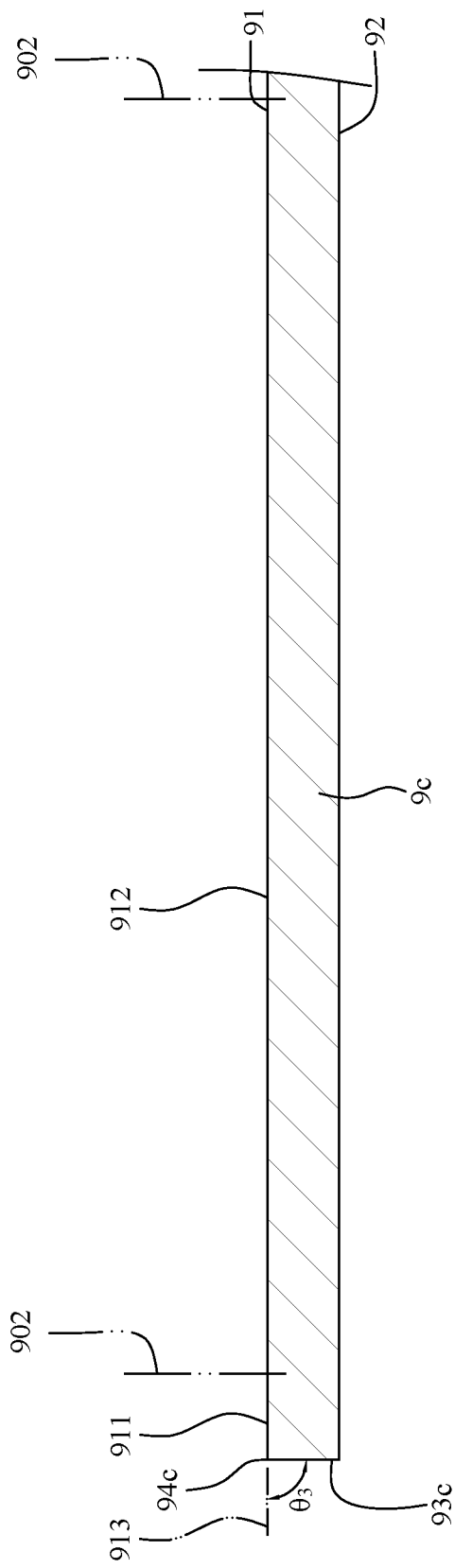
FIG. 34 illustrates one or more stages of an example of a method for manufacturing an assembly structure according to some embodiments of the present disclosure.

Referring to FIG. 34, the carrier 9c is provided. The carrier 9c may be similar to the carrier 9 of FIG. 6, except that a lateral side surface 93c of the carrier 9c is a flat surface. Further, the carrier 9c may have a circumference edge 94c that is an intersection between the top surface 91 and the lateral side surface 93c. The second included angle $\theta_3$ between the imaginary surface 913 extending from the main portion 912 and the lateral side surface 93c is substantially 90 degrees.

Figure 35:
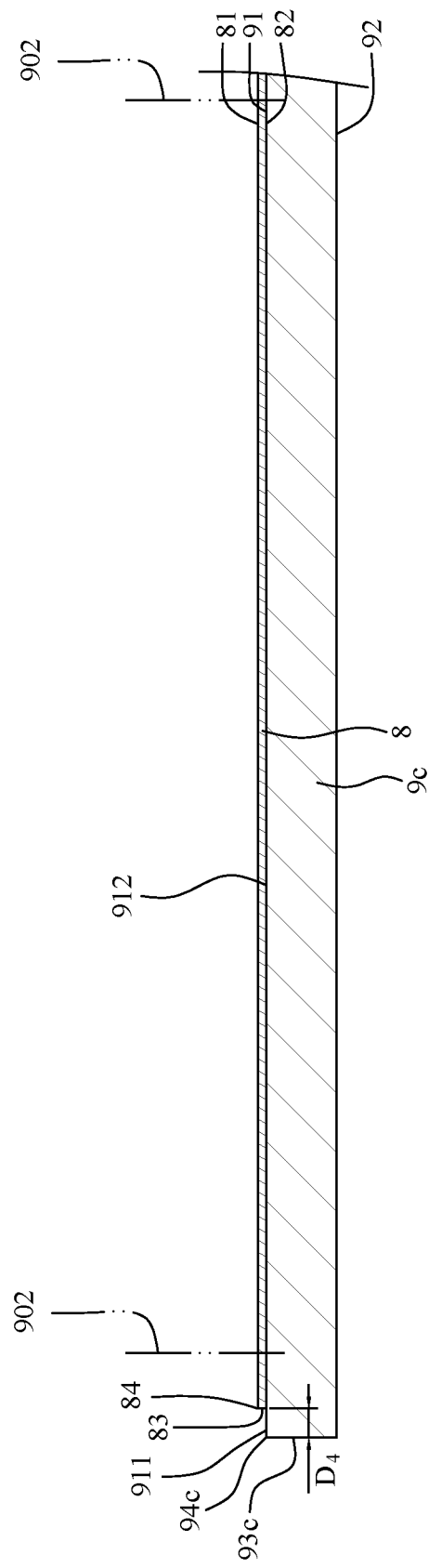
FIG. 35 illustrates one or more stages of an example of a method for manufacturing an assembly structure according to some embodiments of the present disclosure.

Referring to FIG. 35, an under layer 8 is formed on the top surface 91 of the carrier 9c. Then, a peripheral portion of the under layer 8 may be removed so as to expose a flat portion 911 of the top surface 91 of the carrier 9. A distance (or a gap) $D_4$ between the circumference edge 84 of the under layer 8 and the circumference edge 94c of the carrier 9c may be greater than 0.1 mm and less than 0.5 mm. The distance (or a gap) $D_4$ of FIG. 35 may be equal to the distance $D_1$ of FIG. 9.

Figure 36:
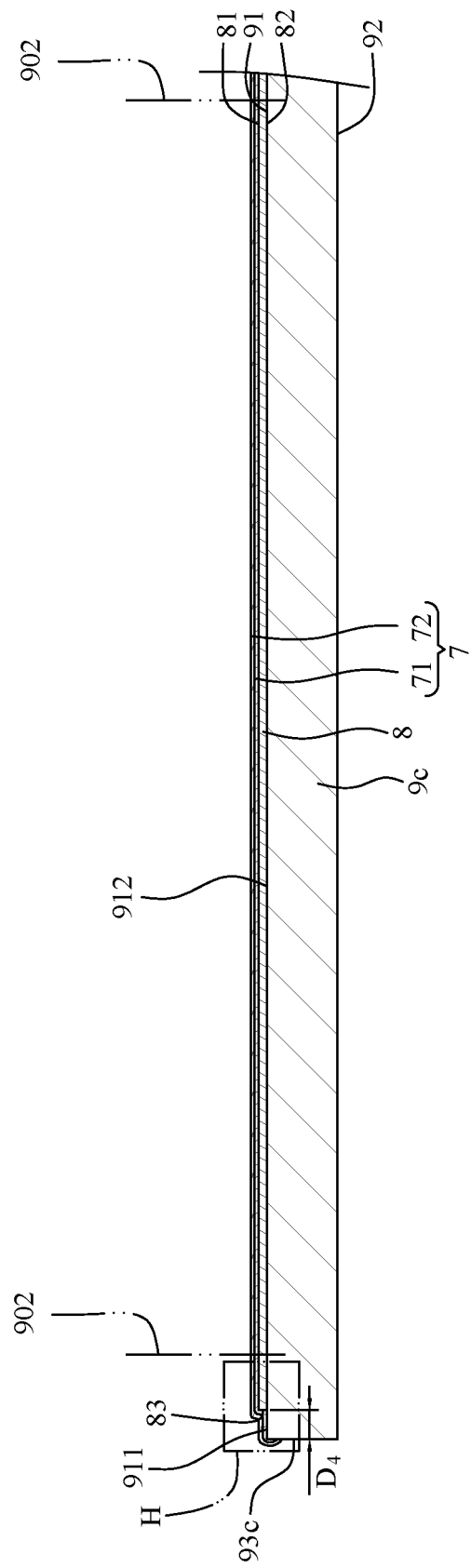
FIG. 36 illustrates one or more stages of an example of a method for manufacturing an assembly structure according to some embodiments of the present disclosure.
Figure 37:
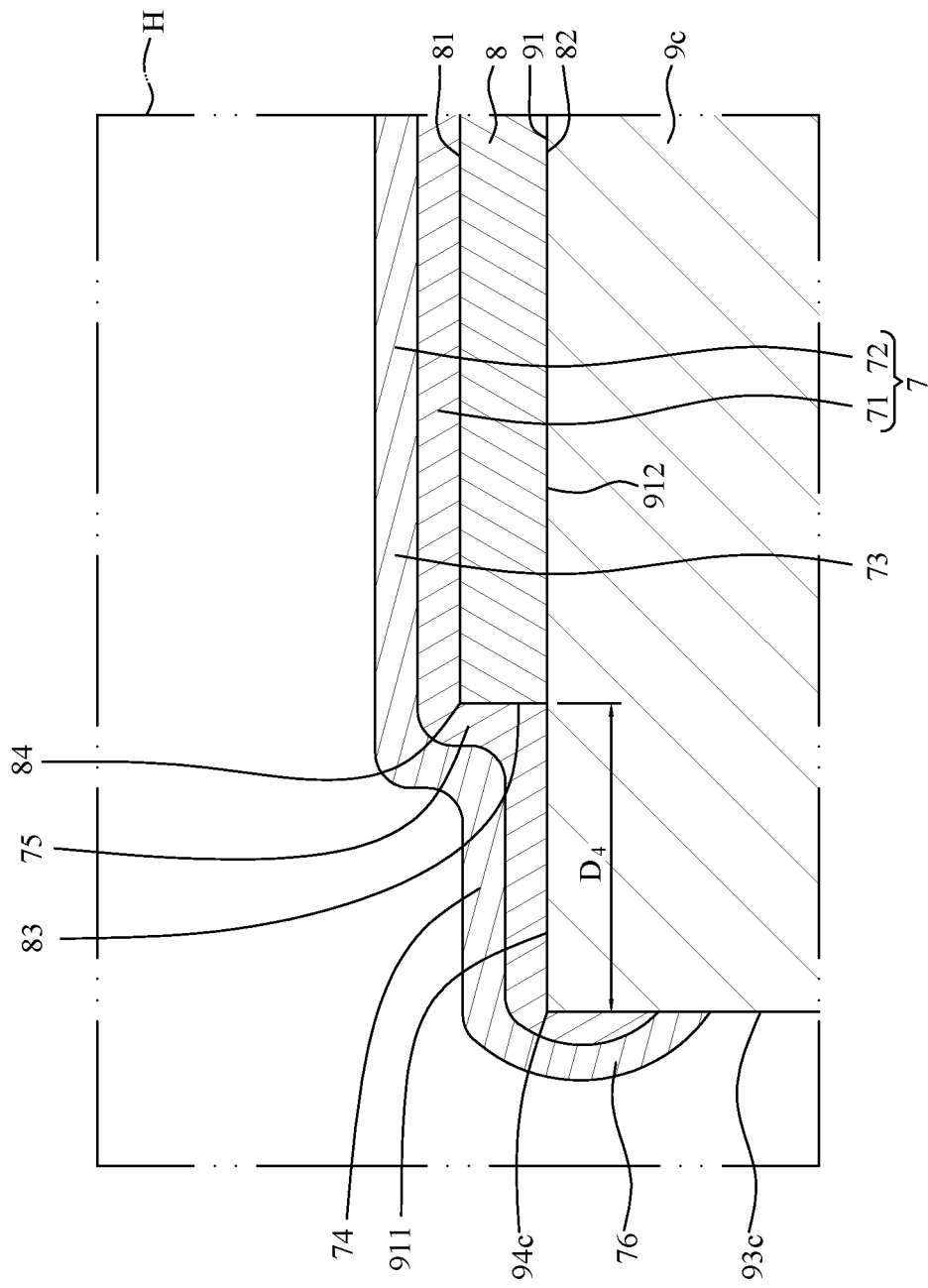
FIG. 37 illustrates one or more stages of an example of a method for manufacturing an assembly structure according to some embodiments of the present disclosure.

Referring to FIG. 36 and FIG. 37, wherein FIG. 37 illustrates an enlarged cross-sectional view of a region "H" of FIG. 36, a seed layer 7 is formed on the under layer 8. In some embodiments, the seed layer 7 may cover and contact the entire top surface 81 of the under layer 8, the lateral side surface 83 of the under layer 8, the exposed flat portion 911 of the top surface 91 of the carrier 9c and the lateral side surface 93c of the carrier 9c. As shown in FIG. 37, the seed layer 7 may include a main portion 73, a peripheral portion 74, a connecting portion 75 and an extending portion 76. The main portion 73 is disposed on the top surface 81 of under layer 8. The peripheral portion 74 is disposed on and contact the exposed flat portion 911 of the carrier 9c. The connecting portion 75 extends between the main portion 73 and the peripheral portion 74. The connecting portion 75 is disposed on the lateral side surface 83 of the under layer 8. The extending portion 76 is disposed on the lateral side surface 93c of the carrier 9c. As shown in FIG. 37, the main portion 73, the connecting portion 75 and the peripheral portion 74 of the seed layer 7 form a step structure.

Figure 38:
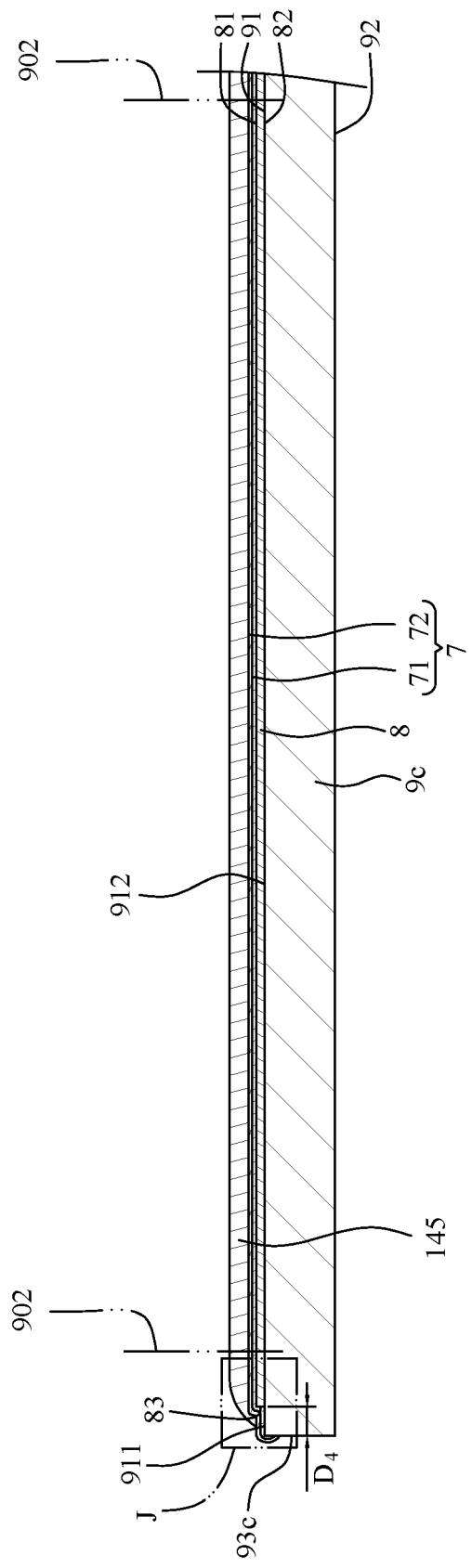
FIG. 38 illustrates one or more stages of an example of a method for manufacturing an assembly structure according to some embodiments of the present disclosure.
Figure 39:
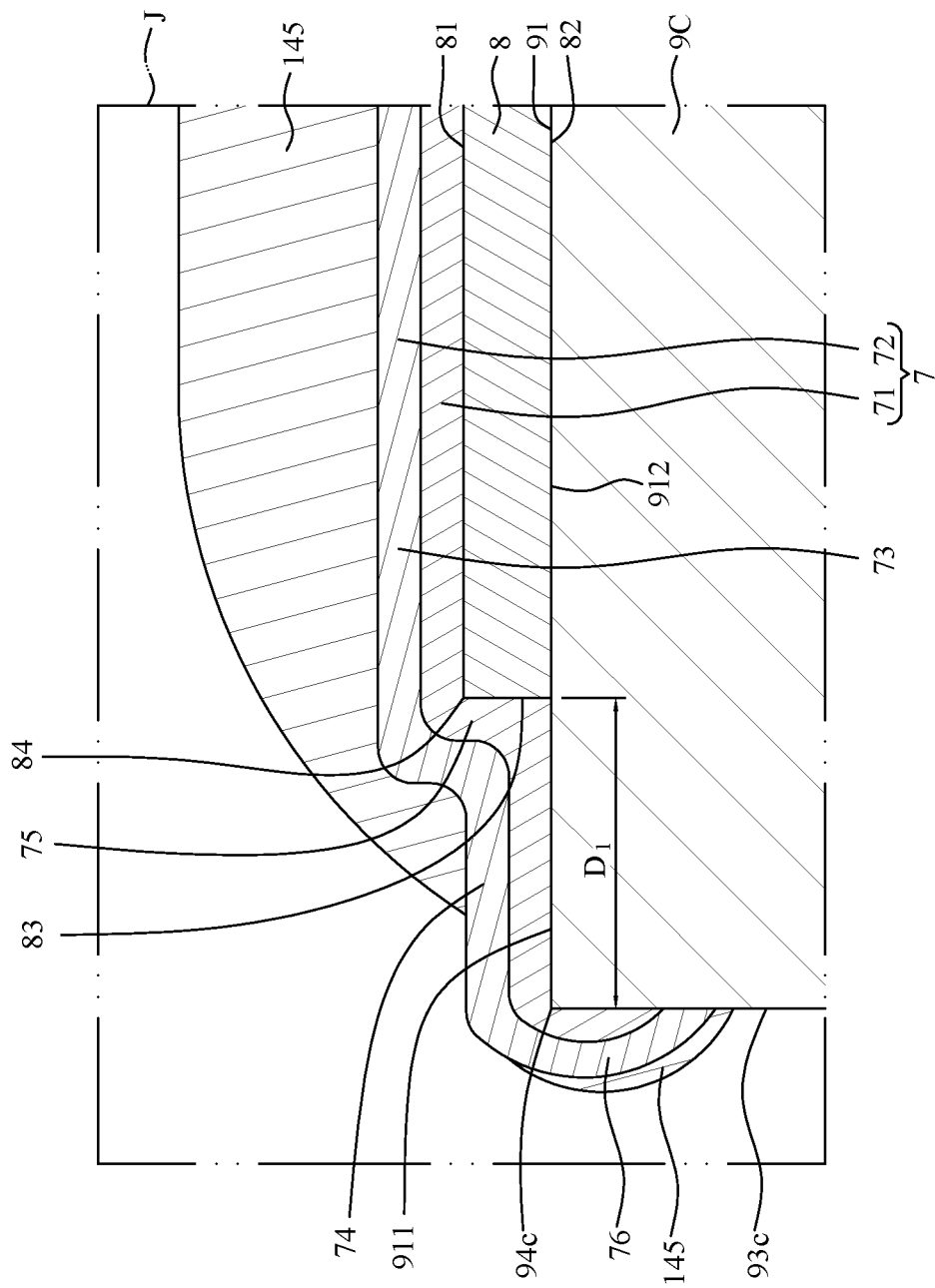
FIG. 39 illustrates one or more stages of an example of a method for manufacturing an assembly structure according to some embodiments of the present disclosure.

Referring to FIG. 38 and FIG. 39, wherein FIG. 39 illustrates an enlarged cross-sectional view of a region "J" of FIG. 38, a material (e.g., a fifth dielectric layer 145 (i.e., a bottommost dielectric layer)) in a flowable state is formed on the seed layer 7.

Figure 40:
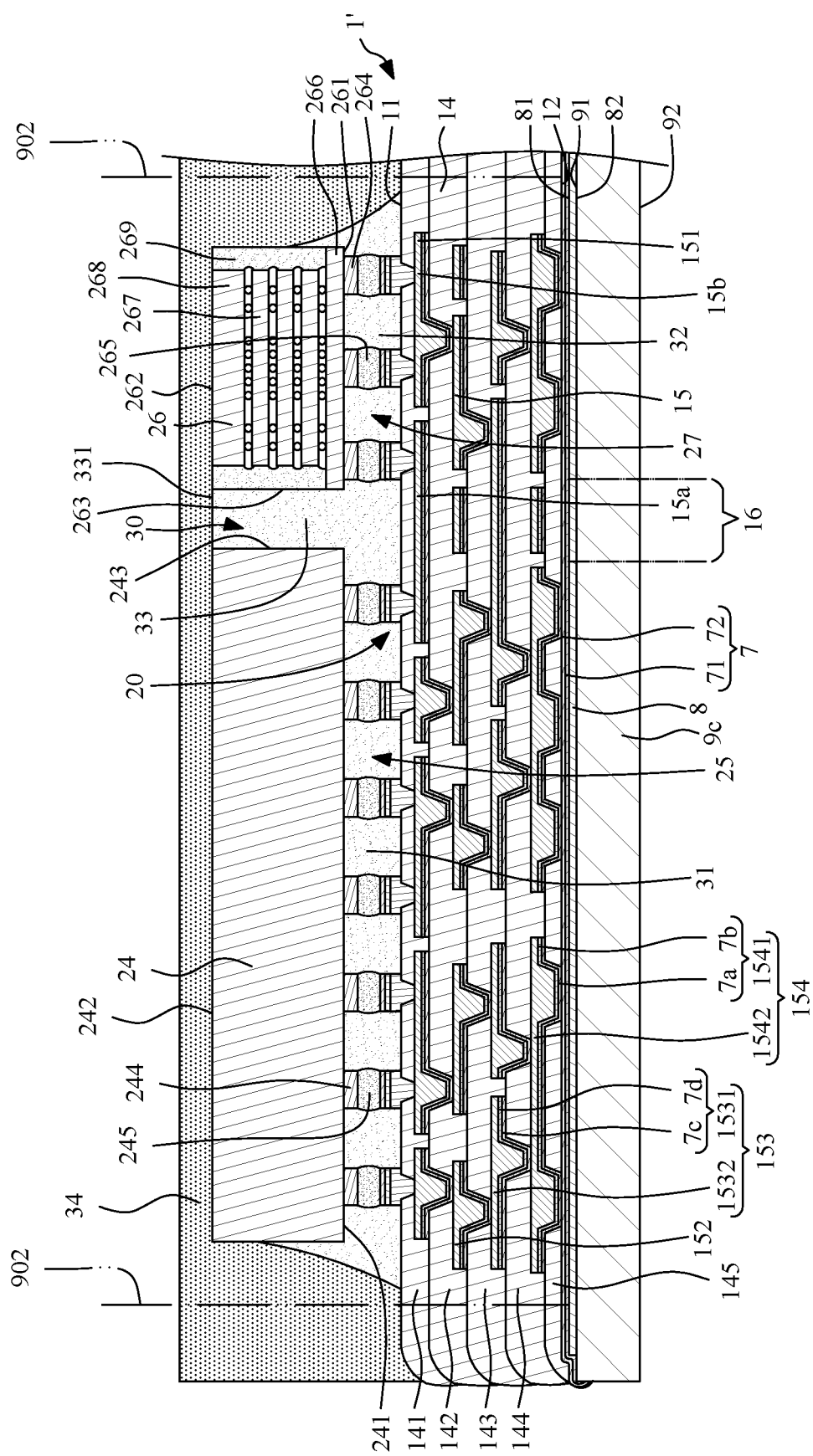
FIG. 40 illustrates one or more stages of an example of a method for manufacturing an assembly structure according to some embodiments of the present disclosure.

Then, the following stages of the method may be similar to the stages illustrated in FIG. 12 to FIG. 20 so as to form or dispose the circuit structure 1' (e.g., the wiring structure 1'), the first electronic device 24, the second electronic device 26, the protection material 33 and the encapsulant 34 on the seed layer 7, as shown in FIG. 40.

Then, the following stages of the method may be similar to the stages illustrated in FIG. 21 to FIG. 23 so as to obtain the assembly structure 4 as shown in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A manufacturing method, comprising:
   (a) providing a carrier having a top surface and a lateral side surface, wherein the top surface includes a main portion and a flat portion connecting the lateral side surface, and a first included angle between the main portion and the flat portion is less than a second included angle between the main portion and the lateral side surface;
   (b) forming an under layer on the carrier to at least partially expose the flat portion;
   (b1) forming a first seed layer on the under layer;
   (b2) removing a portion of the first seed layer to expose a second peripheral portion of the under layer; and (c) forming a dielectric layer on the under layer and covering the exposed flat portion.

2. The manufacturing method of claim 1, wherein in (c), the dielectric layer further covers a lateral side surface of the under layer.

3. The manufacturing method of claim 2, wherein in (c), the dielectric layer contacts the flat portion.

4. The manufacturing method of claim 3, wherein in (c), the dielectric layer contacts the first seed layer on the under layer.

5. The manufacturing method of claim 1, wherein (b) includes: removing a first peripheral portion of the under layer to expose the flat portion.

6. The manufacturing method of claim 1, wherein the first seed layer covers a lateral side surface of the under layer.

7. The manufacturing method of claim 6, wherein the first seed layer contacts the flat portion.

8. The manufacturing method of claim 1, wherein after (b1), the method further includes:

(b3) removing the portion of the first seed layer to expose a portion of the flat portion of the top surface of the carrier.

9. The manufacturing method of claim 1, wherein (c) includes: coating a dielectric layer in a flowable state on the under layer.

10. The manufacturing method of claim 9, wherein (c) includes: spin-coating the dielectric layer on the under layer.

11. The manufacturing method of claim 1, wherein after (c), the method further comprises:

(d) forming a second seed layer on the dielectric layer; and (e) removing a portion of the second seed layer.

12. The manufacturing method of claim 11, wherein (f) (e) includes: removing the portion of the second seed layer by etching process.

* * * * *